(12) United States Patent
Park et al.

(10) Patent No.: US 9,704,864 B2
(45) Date of Patent: Jul. 11, 2017

(54) SEMICONDUCTOR DEVICES INCLUDING AN ISOLATION LAYER ON A FIN AND METHODS OF FORMING SEMICONDUCTOR DEVICES INCLUDING AN ISOLATION LAYER ON A FIN

(71) Applicants: Sang-Jine Park, Yongin-si (KR); Bo-Un Yoon, Seoul (KR); Ha-Young Jeon, Hwaseong-si (KR); Yeon-Jin Gil, Daegu (KR); Ji-Won Yun, Hwaseong-si (KR); Won-Sang Choi, Seoul (KR)

(72) Inventors: Sang-Jine Park, Yongin-si (KR); Bo-Un Yoon, Seoul (KR); Ha-Young Jeon, Hwaseong-si (KR); Yeon-Jin Gil, Daegu (KR); Ji-Won Yun, Hwaseong-si (KR); Won-Sang Choi, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 8 days.

(21) Appl. No.: 14/746,229

(22) Filed: Jun. 22, 2015

(65) Prior Publication Data

US 2016/0043170 A1 Feb. 11, 2016

(30) Foreign Application Priority Data

Aug. 11, 2014 (KR) ........................ 10-2014-0103843

(51) Int. Cl.
*H01L 21/70* (2006.01)
*H01L 27/092* (2006.01)
*H01L 29/78* (2006.01)
*H01L 27/088* (2006.01)
*H01L 29/165* (2006.01)
*H01L 21/8238* (2006.01)

(52) U.S. Cl.
CPC ...... *H01L 27/0924* (2013.01); *H01L 27/0886* (2013.01); *H01L 29/785* (2013.01); *H01L 29/7846* (2013.01); *H01L 29/7848* (2013.01); *H01L 21/823807* (2013.01); *H01L 21/823821* (2013.01); *H01L 21/823878* (2013.01); *H01L 29/165* (2013.01)

(58) Field of Classification Search
CPC ............... H01L 29/0649; H01L 29/785; H01L 29/7843; H01L 27/0924
See application file for complete search history.

(56) References Cited

U.S. PATENT DOCUMENTS 7,923,337 B2 4/2011 Chang et al.
8,264,048 B2 9/2012 Rachmady et al.
(Continued)

FOREIGN PATENT DOCUMENTS

JP 2013-058688 3/2013
KR 1020090064746 A 6/2009

*Primary Examiner* — A. Sefer
(74) *Attorney, Agent, or Firm* — Myers Bigel, P.A.

(57) ABSTRACT

Semiconductor devices are provided. A semiconductor device includes a fin protruding from a substrate. Moreover, the semiconductor device includes first and second gate structures on the fin, and an isolation region between the first and second gate structures. The isolation region includes first and second portions having different respective widths. Related methods of forming semiconductor devices are also provided.

19 Claims, 30 Drawing Sheets

(56) References Cited

U.S. PATENT DOCUMENTS

| | | | |
|---|---|---|---|
| 8,518,813 B2 | 8/2013 | Yamakawa | |
| 8,637,359 B2 | 1/2014 | Chang et al. | |
| 8,637,371 B2 | 1/2014 | Chang et al. | |
| 8,835,268 B2 | 9/2014 | Sudo | |
| 8,878,309 B1* | 11/2014 | Hong | H01L 27/0886 257/330 |
| 2002/0171118 A1* | 11/2002 | Mandelman | H01L 21/764 257/510 |
| 2007/0134884 A1* | 6/2007 | Kim | H01L 21/823437 438/424 |
| 2010/0159683 A1* | 6/2010 | Lee | H01L 21/28123 438/585 |
| 2011/0298041 A1* | 12/2011 | Renn | H01L 27/10826 257/330 |
| 2012/0126883 A1* | 5/2012 | Juengling | H01L 21/823431 327/581 |
| 2013/0175584 A1 | 7/2013 | Ho et al. | |
| 2014/0151810 A1* | 6/2014 | Maeda | H01L 29/41791 257/365 |
| 2014/0159158 A1* | 6/2014 | Kim | H01L 27/088 257/368 |
| 2014/0213037 A1* | 7/2014 | LiCausi | H01L 21/76224 438/429 |

* cited by examiner

1200

1300

1400

SEMICONDUCTOR DEVICES INCLUDING AN ISOLATION LAYER ON A FIN AND METHODS OF FORMING SEMICONDUCTOR DEVICES INCLUDING AN ISOLATION LAYER ON A FIN

CROSS-REFERENCE TO RELATED APPLICATION

This application claims priority under 35 U.S.C. 119 to Korean Patent Application No. 10-2014-0103843, filed on Aug. 11, 2014 in the Korean Intellectual Property Office, the content of which is hereby incorporated herein by reference in its entirety.

BACKGROUND

The present disclosure relates to semiconductor devices and a method of forming semiconductor devices. As one example of scaling techniques for increasing the density of integrated circuit devices, a multi-gate transistor has been proposed, in which a fin-shaped or nanowire-shaped silicon body is formed on a substrate and a gate is then formed on a surface of the silicon body. Because the multi-gate transistor uses a three-dimensional (3D) channel, scaling of the multi-gate transistor may be relatively easily achieved. In addition, current controlling capability can be improved even without increasing a gate length of the multi-gate transistor. Further, a short channel effect (SCE), in which an electric potential of a channel region is affected by a drain voltage, can be reduced.

SUMMARY

Various embodiments of present inventive concepts provide a semiconductor device having improved product reliability. Moreover, various embodiments of present inventive concepts provide a method for fabricating a semiconductor device having improved product reliability. According to various embodiments of present inventive concepts, a semiconductor device may include a fin on a substrate and extending in a first direction. The semiconductor device may include first and second transistors on the fin and spaced apart from each other in the first direction. The semiconductor device may include a first isolation layer in the fin between the first and second transistors, the first isolation layer extending in a second direction intersecting the first direction and isolating the first and second transistors from each other. Moreover, the semiconductor device may include a second isolation layer on the first isolation layer and extending in the second direction. The second isolation layer may include first and second regions including different first and second widths, respectively.

In various embodiments, the first region of the second isolation layer may be on a top portion of the second region of the second isolation layer, and the first width of the first region of the second isolation layer may be wider than the second width of the second region of the second isolation layer. Moreover, the first isolation layer may include a third width that is different from the first and second widths of the second isolation layer. In some embodiments, the third width of the first isolation layer may be narrower than the first and second widths of the second isolation layer. In some embodiments, the semiconductor device may include first and second inner spacers on first and second side surfaces, respectively, of the first isolation layer, and may include first and second dummy spacers on third and fourth side surfaces of the first and second inner spacers, respectively, where the inner spacers and the dummy spacers may include different materials, respectively. In some embodiments, each of the dummy spacers may include a third region and a fourth region, and the third and fourth regions may include different fourth and fifth widths, respectively. Moreover, in some embodiments, the third region may overlap a portion of the fourth region, and the fourth width of the third region may be narrower than the fifth width of the fourth region.

According to various embodiments, the first and second isolation layers may include a nitride layer and an oxide layer, respectively. Additionally or alternatively, the first and second isolation layers each include an oxide layer. In some embodiments, the oxide layer of the second isolation layer may include a first oxide layer, and the first isolation layer may include a second oxide layer upwardly extending along side surfaces of the nitride layer of the first isolation layer. In some embodiments, the oxide layer of the second isolation layer may include a first oxide layer, the first isolation layer may include a second oxide layer, and the nitride layer of the first isolation layer may upwardly extend along side surfaces of the second oxide layer of the first isolation layer. In some embodiments, the second isolation layer may include a third region including a third width that is different from the first and second widths of the first and second regions. The third region may underlie the second region, and the third width of the third region may be narrower than the second width of the second region.

In various embodiments, the first isolation layer and the second isolation layer may include the same material. Moreover, the semiconductor device may include a gap within the second isolation layer. Additionally or alternatively, the semiconductor device may include a protection layer that is on the second isolation layer and that includes a nitride layer.

A semiconductor device, according to various embodiments, may include a fin on a substrate and extending in a first direction. The semiconductor device may include first and second transistors on the fin and spaced apart from each other in the first direction. The semiconductor device may include an isolation layer in the fin between the first and second transistors, the isolation layer extending in a second direction intersecting the first direction and isolating the first and second transistors from each other. Moreover, the semiconductor device may include spacers on at least one side of the isolation layer, where the isolation layer includes a first region on side surfaces of the spacers and a second region that overlaps the spacers, and where the first region includes a narrower width than the second region.

In various embodiments, the spacers may include inner spacers and dummy spacers including different materials, respectively. Moreover, the first region of the isolation layer may be on side surfaces of the inner spacers and side surfaces of the dummy spacers, and the second region may be on top portions of the inner spacers and the side surfaces of the dummy spacers. In some embodiments, the first and second regions may include a nitride layer and an oxide layer, respectively.

According to various embodiments, the spacers may include inner spacers and dummy spacers including different materials, respectively, where the first region may be on top portions of the inner spacers and side surfaces of the dummy spacers, and where the second region may be on the top portions of the inner spacers and top portions of the dummy spacers. In some embodiments, the first and second regions may include an oxide layer.

In various embodiments, the spacers may include inner spacers and dummy spacers including different materials, respectively, where the isolation layer may include a third region including a wider width than the second region, where the first region may be on side surfaces of the inner spacers, where the second region may be on top portions of the inner spacers and side surfaces of the dummy spacers, and where the third region may be on the top portions of the inner spacers and top portions of the dummy spacers. In some embodiments, the first region may include a nitride layer, and the second and third regions may include an oxide layer. Moreover, in some embodiments, the spacers may include: inner spacers including an oxide layer; and dummy spacers including a nitride layer.

A semiconductor device, according to various embodiments, may include a fin on a substrate and extending in a first direction. The semiconductor device may include a first transistor on the fin and including a first spacer. The semiconductor device may include a second transistor on the fin, spaced apart from the first transistor in the first direction, and including a second spacer. The semiconductor device may include an isolation layer in the fin between the first and second transistors, the isolation layer extending in a second direction intersecting the first direction and isolating the first and second transistors from each other. Moreover, the semiconductor device may include dummy spacers on at least one side of the isolation layer, where heights of top surfaces of the dummy spacers are shorter than heights of top surfaces of the first and second spacers.

In various embodiments, the isolation layer may include an oxide layer and a nitride layer. Moreover, the oxide layer may be on a top surface of the nitride layer.

According to various embodiments, each of the dummy spacers may include a first region and a second region underlying the first region. The first region may have a narrower width than the second region. Moreover, a height of a top surface of the first region may be shorter than heights of the top surfaces of the first and second spacers. Additionally or alternatively, the semiconductor device may include a gate capping layer of the first and second transistors, where a top surface of the gate capping layer, the top surfaces of the first and second spacers, and a top surface of the isolation layer are substantially coplanar.

A semiconductor device, according to various embodiments, may include a substrate including first and second regions. The semiconductor device may include a first fin in the first region and extending in a first direction. The semiconductor device may include first and second transistors on the first fin and spaced apart from each other in the first direction. The semiconductor device may include a first isolation layer in the first fin between the first and second transistors and extending in a second direction intersecting the first direction, the first isolation layer isolating the first and second transistors from each other. The semiconductor device may include a second fin in the second region and extending in the first direction. The semiconductor device may include third and fourth transistors on the second fin and spaced apart from each other in the first direction. The semiconductor device may include a second isolation layer in the second fin between the third and fourth transistors and extending in the second direction, the second isolation layer isolating the third and fourth transistors from each other, where the first isolation layer includes first and second regions thereof including different first and second widths, respectively, and where the first isolation layer and the second isolation layer include different materials, respectively. In some embodiments, the first and second regions of the substrate may include a PMOS region and an NMOS region, respectively, and the first and second isolation layers may include a tensile stress material and a compressive stress material, respectively.

A method for fabricating a semiconductor device, according to various embodiments, may include forming a fin extending in a first direction on a substrate. The method may include forming a first dummy gate electrode on the fin, the first dummy gate electrode extending in a second direction intersecting the first direction and including a first spacer formed on at least one side thereof. The method may include forming a second dummy gate electrode on the fin, the second dummy gate electrode extending in the second direction, spaced apart from the first dummy gate electrode in the first direction, and including a second spacer formed on at least one side thereof. The method may include exposing a top surface of the fin by removing the second dummy gate electrode. The method may include exposing a portion of a top surface of the second spacer and forming an oxide layer on a side surface of the second spacer. The method may include forming a trench in the fin by etching the exposed top surface of the fin, the oxide layer, and the second spacer. The method may include forming a first isolation layer in the trench. The method may include forming a second isolation layer on the first isolation layer, the second isolation layer including a top surface that is substantially coplanar with a top surface of the first spacer. Moreover, the method may include replacing the first dummy gate electrode with a gate structure.

In various embodiments, exposing the top surface of the fin by removing the second dummy gate electrode may include: reducing a height of the top surface of the second spacer to be shorter than a height of the top surface of the first spacer; then exposing the top surface of the fin by removing the second dummy gate electrode. Moreover, in some embodiments, the method may include: forming a first hard mask layer on the first dummy gate electrode; and forming a second hard mask layer on the second dummy gate electrode, where reducing the height of the second spacer may include removing the second hard mask layer while reducing the height of the second spacer.

According to various embodiments, exposing the portion of the top surface of the second spacer and forming the oxide layer on the side surface of the second spacer may include: forming the oxide layer on the top surface and the side surface of the second spacer and the exposed top surface of the fin; and removing a portion of the oxide layer formed on the top surface of the second spacer and the exposed top surface of the fin by anisotropically etching the oxide layer.

In various embodiments, in forming the trench in the fin, the portion of the top surface of the second spacer and a portion of a top surface of the oxide layer may be etched together. Additionally or alternatively, the method may include forming a protection layer on the second isolation layer, where the protection layer includes a nitride layer.

A semiconductor device, according to various embodiments, may include a fin protruding from a substrate. The semiconductor device may include first and second gate structures on the fin. The semiconductor device may include a first source or drain region and a second source or drain region on the fin between the first and second gate structures. Moreover, the semiconductor device may include a non-uniformly-wide isolation region that includes: a first portion thereof in a recess region of the fin that is between and spaced apart from the first source or drain region and the second source or drain region; and a second portion thereof that overlaps the first portion of the non-uniformly-wide isolation region and extends laterally to overlap an upper portion of the fin. The second portion of the non-uniformly-wide isolation region may have a first width that is wider than a second width of the first portion of the non-uniformly-wide isolation region.

In various embodiments, the first and second portions of the non-uniformly-wide isolation region may include first and second isolation layers, respectively, including different respective materials. In some embodiments, the second isolation layer may include a non-uniformly-wide isolation layer that includes: the first width; and a third width that is wider than the second width and unequal to the first width. In some embodiments, the semiconductor device may include a spacer on the fin, the spacer including a first portion thereof that is recessed such that a second portion of the spacer protrudes beyond the first portion of the spacer to extend along a side surface of the non-uniformly-wide isolation layer. In some embodiments, the spacer may be a first spacer, and the semiconductor device may include: a second spacer between the first spacer and the first isolation layer; a protection layer on the second isolation layer; and a gap within the second isolation layer.

According to various embodiments, the substrate may include first and second regions, the fin may include a first fin on the first region of the substrate, and the non-uniformly-wide isolation region may include a first non-uniformly-wide isolation region. Moreover, the semiconductor device may include: a second fin on the second region of the substrate; and a second non-uniformly-wide isolation region spaced apart from and between third and fourth gate structures that are on the second fin. The first and second non-uniformly-wide isolation regions may include tensile-stress and compressive-stress materials, respectively.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Figure 1:
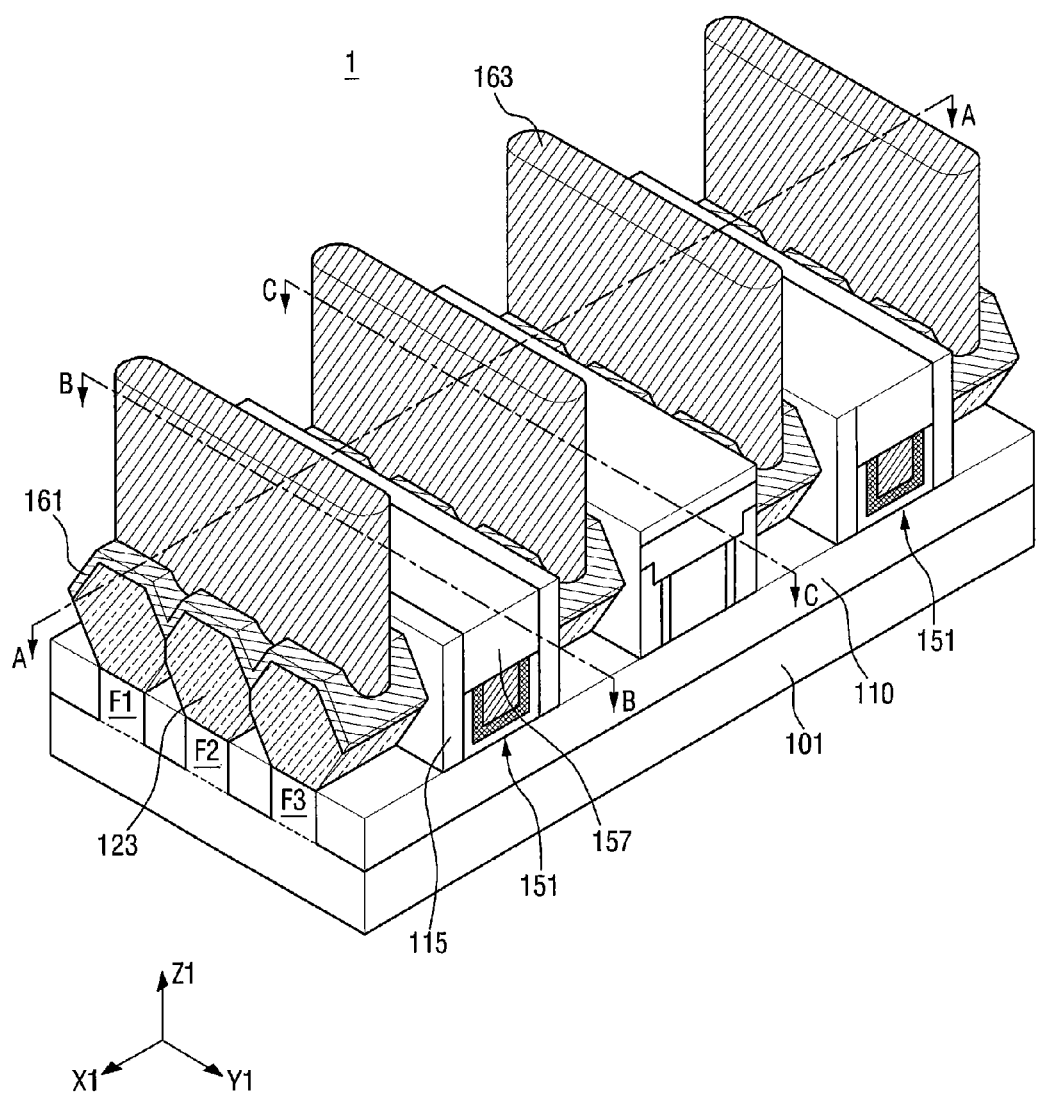
FIG. 1 is a partial perspective view of a semiconductor device according to some embodiments of present inventive concepts.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 2:
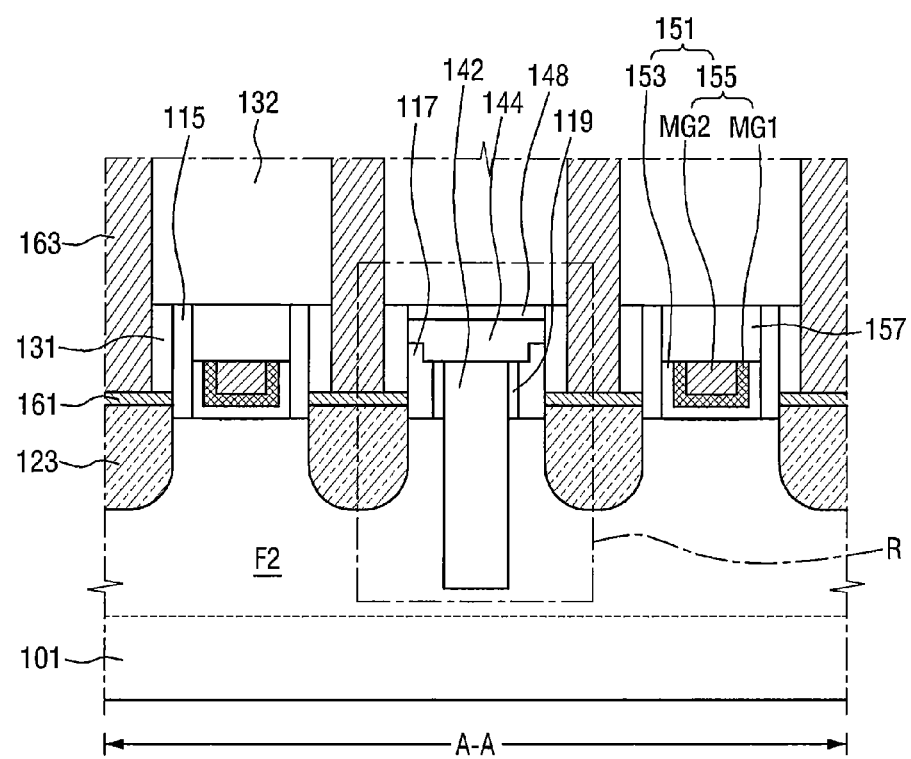
FIG. 2 is a cross-sectional view taken along the line A-A of FIG. 1.
Figure 3:
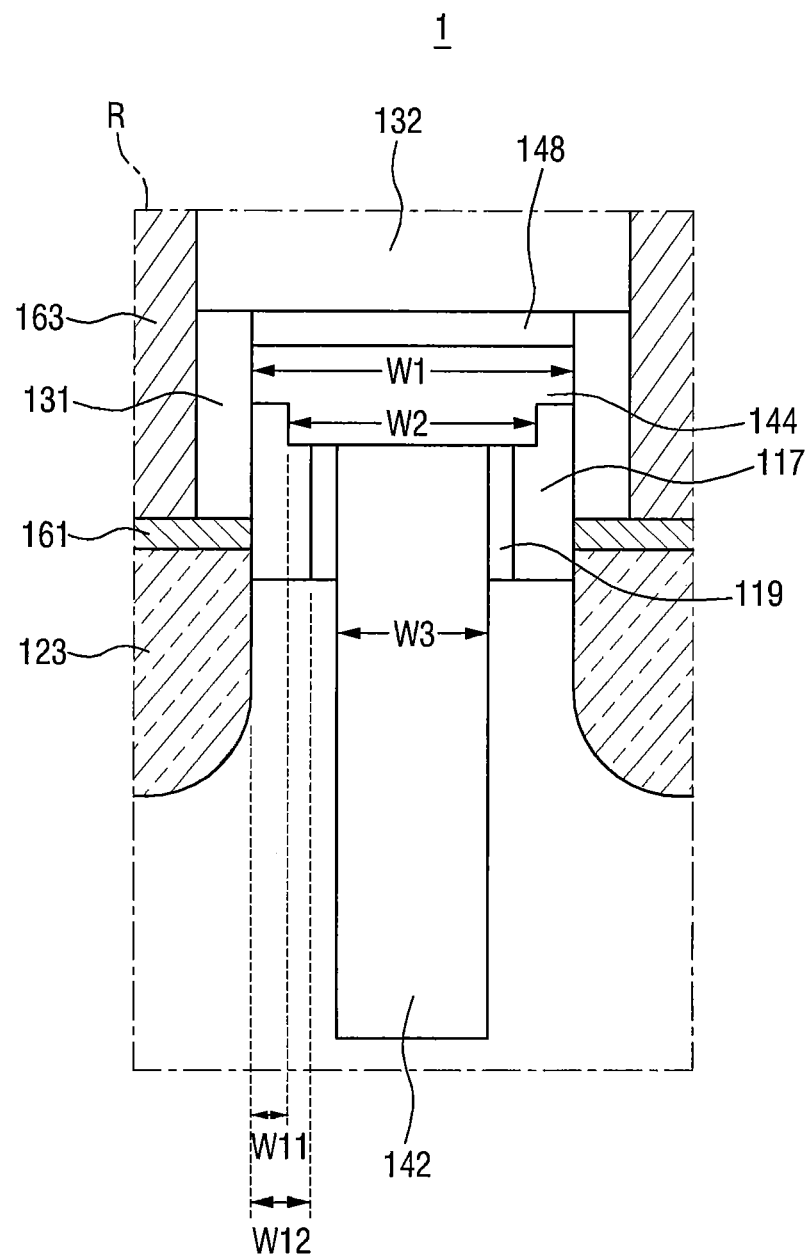
FIG. 3 is an enlarged view of a region 'R' of FIG. 2.
Figure 4:
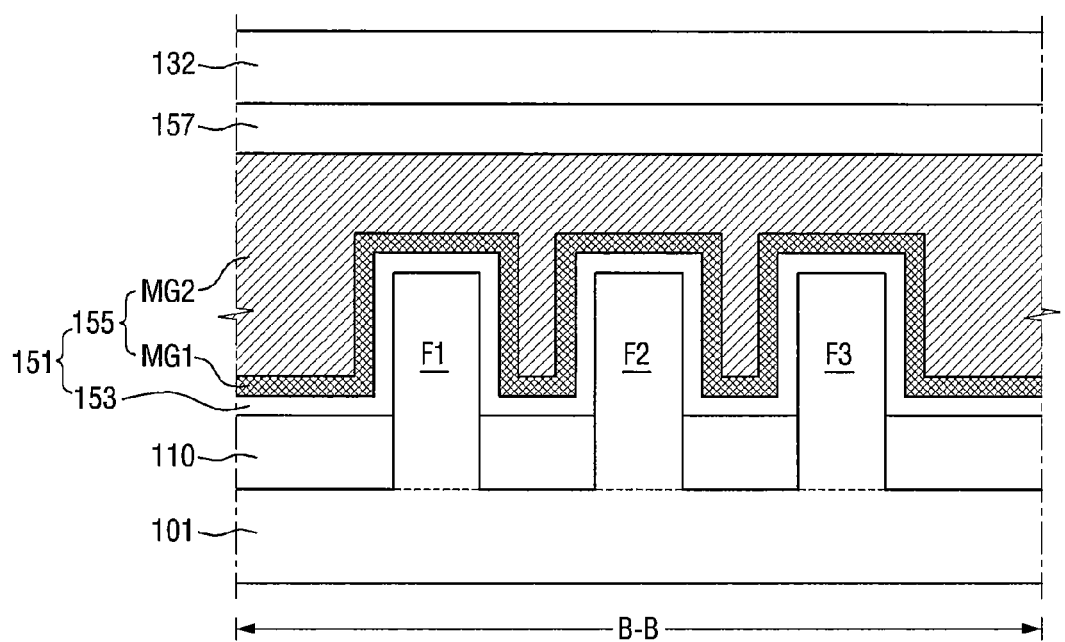
FIG. 4 is a cross-sectional view taken along the line B-B of FIG. 1.
Figure 5:
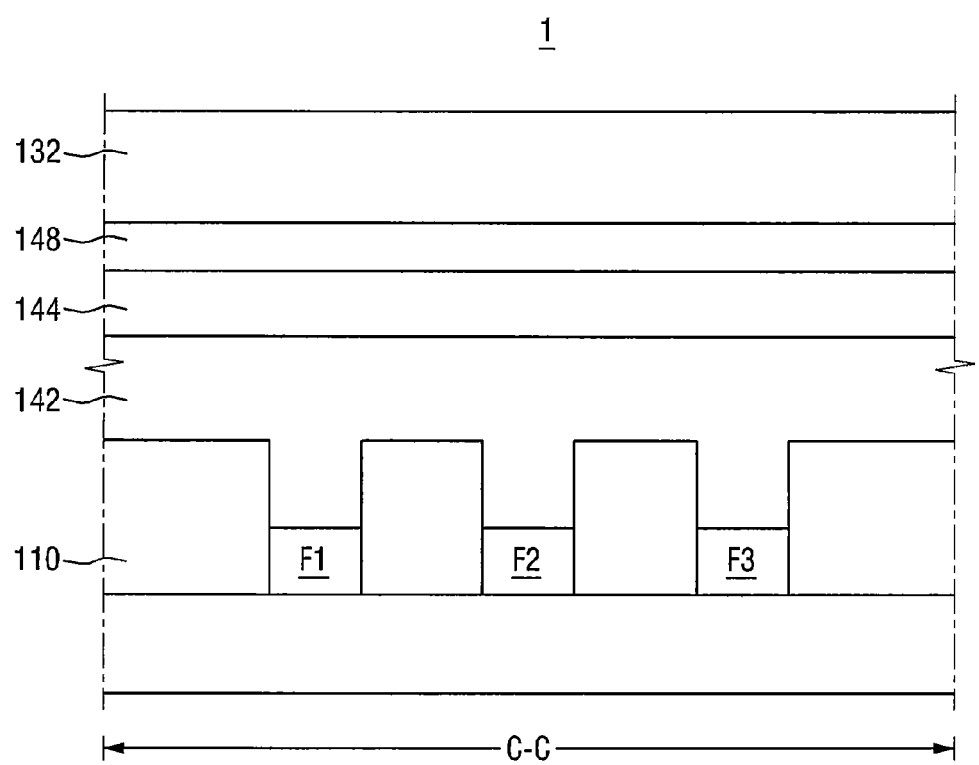
FIG. 5 is a cross-sectional view taken along the line C-C of FIG. 1.

Hereinafter, a semiconductor device according to some embodiments of present inventive concepts will be described with reference to FIGS. 1 to 5. FIG. 1 is a partial perspective view of a semiconductor device according to some embodiments of present inventive concepts, FIG. 2 is a cross-sectional view taken along the line A-A of FIG. 1, FIG. 3 is an enlarged view of a region 'R' of FIG. 2, FIG. 4 is a cross-sectional view taken along the line B-B of FIG. 1, and FIG. 5 is a cross-sectional view taken along the line C-C of FIG. 1.

First and second interlayer insulation layers 131 and 132 are shown in FIGS. 2 to 5.

Referring to FIGS. 1 to 5, the semiconductor device 1 may include a substrate 101, first to third fins F1, F2 and F3, a field insulation layer 110, a normal gate electrode 155, normal spacers 115, a first isolation layer 142, a second isolation layer 144, dummy spacers 117, source/drain regions 123, first and second interlayer insulation layers 131 and 132, a silicide layer 161, and a contact 163. As used herein, the term "normal" may refer to a non-dummy element, such as a non-dummy spacer or another non-dummy element.

The substrate 101 may include a semiconductor material. Examples of the semiconductor material may include one or more materials selected from the group consisting of Silicon (Si), Germanium (Ge), Silicon Germanium (SiGe), Gallium Phosphide (GaP), Gallium Arsenide (GaAs), Silicon Carbide (SiC), Silicon Germanium Carbide (SiGeC), Indium Arsenide (InAs), and Indium Phosphide (InP), but not limited thereto. In some embodiments of present inventive concepts, the substrate 101 may be an insulating substrate. That is to say, the substrate 101 may include, for example, a silicon on insulator (SOI) substrate.

The first to third fins F1 to F3 may protrude from the substrate 101 in a third direction Z1. The first to third fins F1 to F3 may extend lengthwise in a lengthwise direction, that is, in a first direction X1.

The first to third fins F1 to F3 may have long sides and short sides. The first to third fins F1 to F3 may be spaced apart from each other to then be disposed on the substrate 101. For example, the first to third fins F1 to F3 may be spaced apart from each other in a second direction Y1. In FIG. 1, the long side direction is the first direction X1 and the short side direction is the second direction Y1, but aspects of present inventive concepts are not limited thereto. In the first to third fins F1 to F3, for example, the long side direction may be the second direction Y1 and the short side direction may be the first direction X1.

The first to third fins F1 to F3 may be respective portions of the substrate 101 or may include epitaxial layers grown from the substrate 101.

The first to third fins F1 to F3 may include a semiconductor material. The first to third fins F1 to F3 may include, for example, Si or SiGe. In some embodiments of present inventive concepts, the first to third fins F1 to F3 may include the same material as the substrate 101, but aspects of present inventive concepts are not limited thereto.

The field insulation layer 110 is formed on the substrate 101 and may expose a top portion of the fin F1 while covering portions of sidewalls of the fin F1. The field insulation layer 110 may be, for example, an oxide layer.

As shown, normal gate structures 151 may be disposed on the first to third fins F1 to F3 to be spaced apart from each other in the first direction X1. The normal gate structures 151 may cross/overlap the first to third fins F1 to F3. That is to say, the normal gate structures 151 may be formed on the first to third fins F1 to F3 to extend in the second direction Y1.

In FIG. 1, the normal gate structures 151 extend in the second direction Y1, but aspects of present inventive concepts are not limited thereto. The normal gate structures 151 may cross the first to third fins F1 to F3 while forming acute angles or obtuse angles with respect to the first to third fins F1 to F3.

Each of the normal gate structures 151 may include a gate insulation layer 153 and a normal gate electrode 155.

The gate insulation layer 153 may include a high-k material having a higher dielectric constant than a silicon oxide layer. The gate insulation layer 153 may include, for example, Hafnium Oxide ($HfO_2$), Zirconium Dioxide ($ZrO_2$), Lanthanum Oxide (LaO), Aluminum Oxide ($Al_2O_3$), or Tantalum Pentoxide ($Ta_2O_5$), but aspects of present inventive concepts are not limited thereto.

As shown in FIG. 2, the gate insulation layer 153 may upwardly extend on top surfaces of the first to third fins F1 to F3 and lateral surfaces of the normal gate electrode 155. In addition, as shown in FIG. 4, the gate insulation layer 153 may extend along top surfaces and lateral surfaces of the first to third fins F1 to F3 in the second direction Y1. As used herein, the term "lateral surface" may refer to a side surface.

The normal gate electrode 155 may include first and second metal layers MG1 and MG2. As shown, the normal gate electrode 155 may include two or more stacked metal layers, e.g., the first and second metal layers MG1 and MG2. The first metal layer MG1 may adjust a work function and the second metal layer MG2 may fill a space formed by the first metal layer MG1.

As shown in FIG. 2, the first metal layer MG1 may upwardly extend on top surfaces of the gate insulation layer 153 and lateral surfaces of the second metal layer MG2. In addition, as shown in FIG. 4, the first metal layer MG1 may conformally extend along a top surface of the field insulation layer 110 and the top surfaces and top portions of sidewalls of the first to third fins F1 to F3 in the second direction Y1.

The first metal layer MG1 may include, for example, at least one of Titanium Nitride (TiN), Tantalum Nitride (TaN), Titanium Carbide (TiC), Titanium Aluminum Carbide (TiAlC), and Tantalum Carbide (TaC). The second metal layer MG2 may include, for example, Tungsten (W) or Aluminum (Al).

In some embodiments of present inventive concepts, the normal gate electrode 155 may include a non-metal material, such as Si or SiGe. The normal gate electrode 155 may be formed by, for example, a gate replacement process, but aspects of present inventive concepts are not limited thereto.

A gate capping layer 157 may be formed on the normal gate structures 151.

The normal spacers 115 may be formed on lateral surfaces of the normal gate structures 151. In FIGS. 1 and 2, bar-shaped spacers are illustrated as examples, but aspects of present inventive concepts are not limited thereto. In some embodiments of present inventive concepts, shapes of the normal spacers 115 may vary in various manners.

In some embodiments, the normal spacers 115 may include, for example, a nitride layer, but aspects of present inventive concepts are not limited thereto. The material for forming the normal spacers 115 may vary in various manners. In some embodiments of present inventive concepts, the normal spacers 115 may include, for example, one of an oxide layer and an oxynitride layer.

The source/drain regions 123 may be disposed at opposite sides of the normal gate structures 151. The source/drain regions 123 may be positioned in the first to third fins F1 to F3. That is to say, the source/drain regions 123 may be formed in areas produced by partially etching the first to third fins F1 to F3.

In FIG. 1, the source/drain regions 123 are illustrated as making contact with each other in a second direction Y1, but aspects of present inventive concepts are not limited thereto. The source/drain regions 123 may be spaced apart from each other in the second direction Y1. In some embodiments of present inventive concepts, the source/drain regions 123 may be elevated source/drain regions. Accordingly, top surfaces of the source/drain regions 123 may be higher than top surfaces of the first to third fins F1 to F3.

When the semiconductor device 1 is a PMOS transistor, the source/drain regions 123 may include a compressive stress material. For example, the compressive stress material may be a material having a larger lattice constant than Si (e.g., SiGe). The compressive stress material may apply compressive stress to channel regions disposed under the normal gate structures 151, that is, the first to third fins F1 to F3, thereby improving mobility of carriers in the channel regions.

Meanwhile, when the semiconductor device 1 is an NMOS transistor, the source/drain regions 123 may include the same material as the substrate 101 or a tensile stress material. For example, when the substrate 101 includes Si, the source/drain regions 123 may include Si or a material having a smaller lattice constant than Si (e.g., SiC or SiP). The tensile stress material may apply tensile stress to channel regions disposed under the normal gate structures 151, that is, the first to third fins F1 to F3, thereby improving mobility of carriers in the channel regions. In some embodiments of present inventive concepts, the source/drain regions 123 may be formed by epitaxial growth, but aspects of present inventive concepts are not limited thereto.

The silicide layer 161 may be formed on the source/drain regions 123. The silicide layer 161 may be formed along top surfaces of the source/drain regions 123. The silicide layer 161 may reduce surface resistance or contact resistance applied when the source/drain regions 123 are brought into contact with the contact 163, and may include a conductive material, for example, Platinum (Pt), Nickel (Ni), or Cobalt (Co).

The contact 163 may be formed on the silicide layer 161. The contact 163 may include a conductive material, including, for example, Tungsten (W), Aluminum (Al), or Copper (Cu), but aspects of present inventive concepts are not limited thereto.

The first interlayer insulation layer 131 and the second interlayer insulation layer 132 may be sequentially formed on the field insulation layer 110. The first interlayer insulation layer 131 may cover a portion of the silicide layer 161 and portions of the lateral surfaces of the normal spacers 115 and may cover portions of lateral surfaces of the contact 163.

The second interlayer insulation layer 132 may cover the remaining portions of the lateral surfaces of the contact 163.

As shown in FIG. 2, a top surface of the first interlayer insulation layer 131 may be coplanar with top surfaces of the normal gate structures 151, which is because the top surface of the first interlayer insulation layer 131 and the top surfaces of the normal gate structures 151 are etched together by a planarization process (e.g., a Chemical Mechanical Planarization (CMP) process).

The second interlayer insulation layer 132 may be formed to cover the normal gate structures 151.

In some embodiments, each of the first interlayer insulation layer 131 and the second interlayer insulation layer 132 may include an oxide layer, but aspects of present inventive concepts are not limited thereto. When necessary/desired, the first interlayer insulation layer 131 and the second interlayer insulation layer 132 may be modified to include a nitride layer or an oxynitride layer.

The normal gate structures 151 and the source/drain regions 123 may function as transistors. That is to say, in FIGS. 1 and 2, two transistors spaced apart from each other in the first direction X1 may be defined on the first to third fins F1 to F3.

The first isolation layer 142 may be formed between the two transistors spaced apart from each other in the first direction X1. In detail, the first isolation layer 142 may be formed in the first to third fins F1 to F3 and disposed between the two transistors, which are spaced apart from each other in the first direction X1, to extend in the second direction Y1.

A bottom surface of the first isolation layer 142 may be positioned deeper than bottom surfaces of the source/drain regions 123. Accordingly, the first isolation layer 142 may isolate the two spaced apart transistors from each other.

The first isolation layer 142 may include, for example, a nitride layer.

Inner spacers 119 may be formed on lateral surfaces of the first isolation layer 142. The inner spacers 119 may prevent/protect the adjacent source/drain regions 123 from being damaged while the first isolation layer 142 is formed.

In some embodiments, the inner spacers 119 may include, for example, an oxide layer.

Dummy spacers 117 may be formed on lateral surfaces of the inner spacers 119. Each of the dummy spacers 117 may include a lower region having a relatively large width W12 and an upper region having a relatively small width W11. That is to say, in some embodiments, the dummy spacers 117 may be stepwise formed.

In FIGS. 2 and 3, heights of top surfaces of the dummy spacers 117 may be smaller (e.g., lower/shorter) than heights of top surfaces of the normal spacers 115. In detail, the heights of the top surfaces of the upper regions of the dummy spacers 117 may be smaller (e.g., lower/shorter) than the heights of the top surfaces of the normal spacers 115. In addition, the heights of the top surfaces of the dummy spacers 117 may be smaller (e.g., lower/shorter) than a height of a top surface of the gate capping layer 157.

In addition, in FIGS. 2 and 3, the heights of the top surfaces of the dummy spacers 117 may be higher/taller than the heights of the top surfaces of the inner spacers 119. In detail, the heights of the top surfaces of the upper regions of the dummy spacers 117 may be higher/taller than the heights of the top surfaces of the inner spacers 119.

In some embodiments, the dummy spacers 117 may include, for example, a nitride layer.

The second isolation layer 144 may be formed on the first isolation layer 142. The second isolation layer 144 may also extend in the second direction Y1 to isolate the two spaced-apart transistors from each other.

The second isolation layer 144 may include a lower region having a relatively small width W2 and an upper region having a relatively large width W1. As shown, the upper region of the first isolation layer 144 may be formed on the top surface of each of the dummy spacers 117 and the lower region of the first isolation layer 144 may be formed on lateral surfaces of the dummy spacers 117 and the top surfaces of the inner spacers 119.

The widths W1 and W2 of the second isolation layer 144 may be wider than a width W3 of the first isolation layer 142.

In detail, the width W2 of the lower region of the second isolation layer 144 formed on the lateral surfaces of the dummy spacers 117 and the top surfaces of the inner spacers 119 may be greater than the width W3 of the first isolation layer 142 disposed on lateral surfaces of the inner spacers 119, and the width W1 of the upper region of the second isolation layer 144 disposed on the top surfaces of the dummy spacers 117 may be greater than the width W2 of the lower region of the second isolation layer 144.

With the configurations of the first and second isolation layers 142 and 144, a gap-fill capability may be improved when the first and second isolation layers 142 and 144 are formed.

In some embodiments, the second isolation layer 144 may include, for example, an oxide layer.

The protection layer 148 may be formed on the second isolation layer 144. The protection layer 148 may serve to protect an insulation layer disposed under the protection layer 148 in the process of fabricating the semiconductor device 1 according to some embodiments.

In some embodiments, the protection layer 148 may include, for example, a nitride layer.

As described above, in the semiconductor device 1 according to FIGS. 1-5, to isolate the two spaced-apart transistors from each other, the first and second isolation layers 142 and 144 are formed on/in the first to third fins F1 to F3 and disposed between the two transistors, the first and second isolation layers 142 and 144 having different widths, e.g., W1 and W3. Accordingly, when the first and second isolation layers 142 and 144 are formed, gap-fill capability may be improved, thereby improving the reliability of the semiconductor device 1 according to FIGS. 1-5.

In addition, in the semiconductor device 1 according to FIGS. 1-5, the inner spacers 119 are formed, thereby preventing/protecting adjacent source/drain regions 123 from being damaged when the first and second isolation layers 142 and 144 are formed. Accordingly, the reliability of the semiconductor device 1 may be improved.

In addition, in the semiconductor device 1 according to FIGS. 1-5, because the protection layer 148 is formed on the first and second isolation layers 142 and 144, an insulation layer disposed under the protection layer 148 may not be damaged during the process of fabricating the semiconductor device 1. Accordingly, the reliability of the semiconductor device 1 may be improved.

Figure 6:
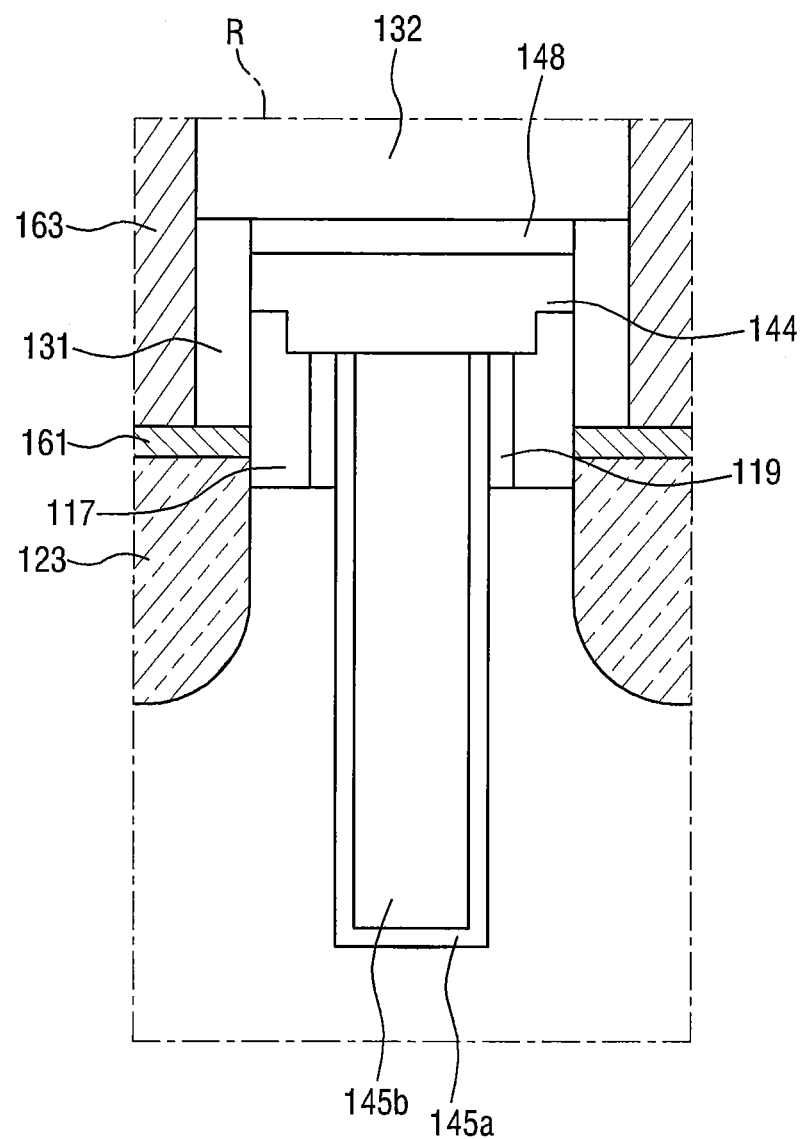
FIG. 6 is a cross-sectional view of a semiconductor device according to some embodiments of present inventive concepts.

FIG. 6 is a cross-sectional view of a semiconductor device 2 according to some embodiments of present inventive concepts. The following description may focus on differences between FIG. 6 and FIGS. 1-5 (in particular, FIG. 3).

Referring to FIG. 6, in the semiconductor device 2, first isolation layers 145a and 145b may include an oxide layer 145a and a nitride layer 145b.

As shown in FIG. 6, the oxide layer 145a may be formed to upwardly extend along lateral surfaces of the nitride layer 145b. The nitride layer 145b may fill a space formed by the oxide layer 145a. In such a manner, the first isolation layers 145a and 145b may improve gap-fill capability.

Figure 7:
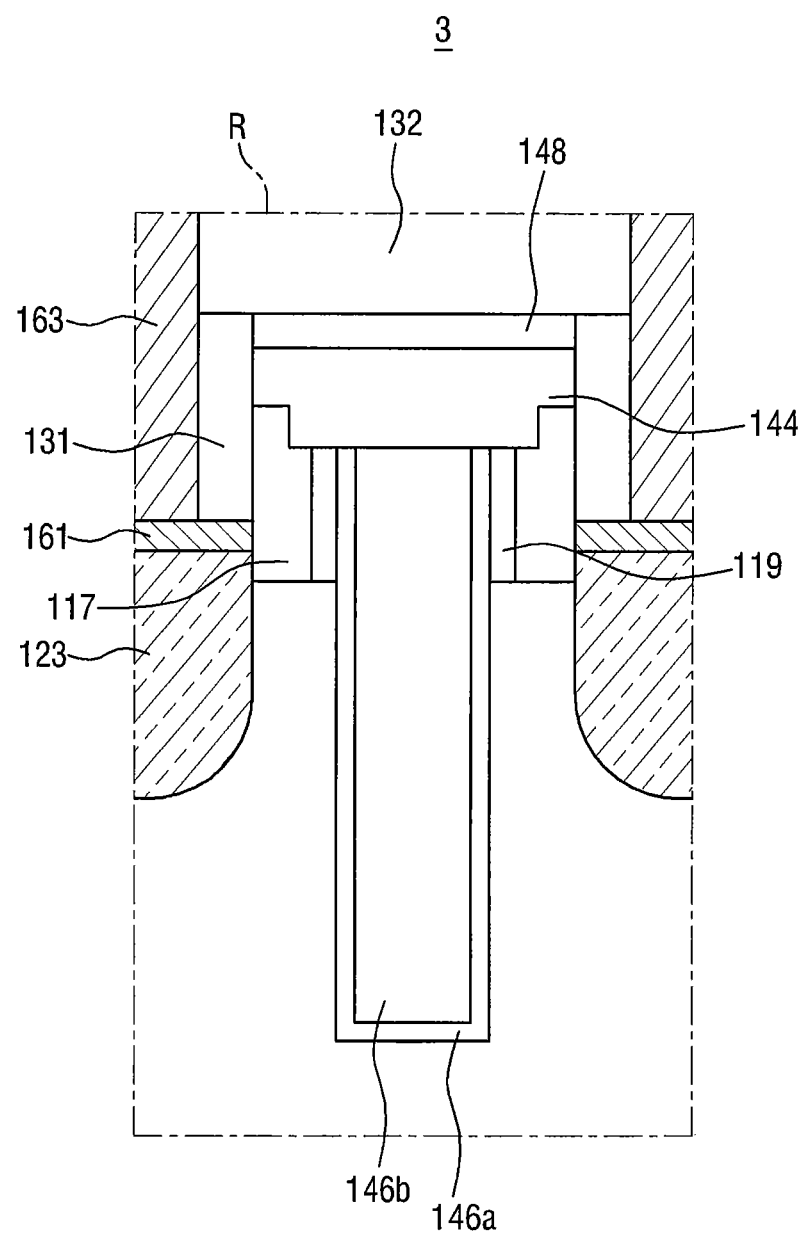
FIG. 7 is a cross-sectional view of a semiconductor device according to some embodiments of present inventive concepts.

FIG. 7 is a cross-sectional view of a semiconductor device 3 according to some embodiments of present inventive concepts. The following description may focus on differences between FIG. 7 and FIGS. 3, 6.

Referring to FIG. 7, in the semiconductor device 3, first isolation layers 146a and 146b may include a nitride layer 146a and an oxide layer 146b.

As shown in FIG. 7, the nitride layer 146a may be formed to upwardly extend along lateral surfaces of the oxide layer 146b. The oxide layer 146b may fill a space formed by the nitride layer 146a. In such a manner, the first isolation layers 146a and 146b may improve gap-fill capability.

Figure 8:
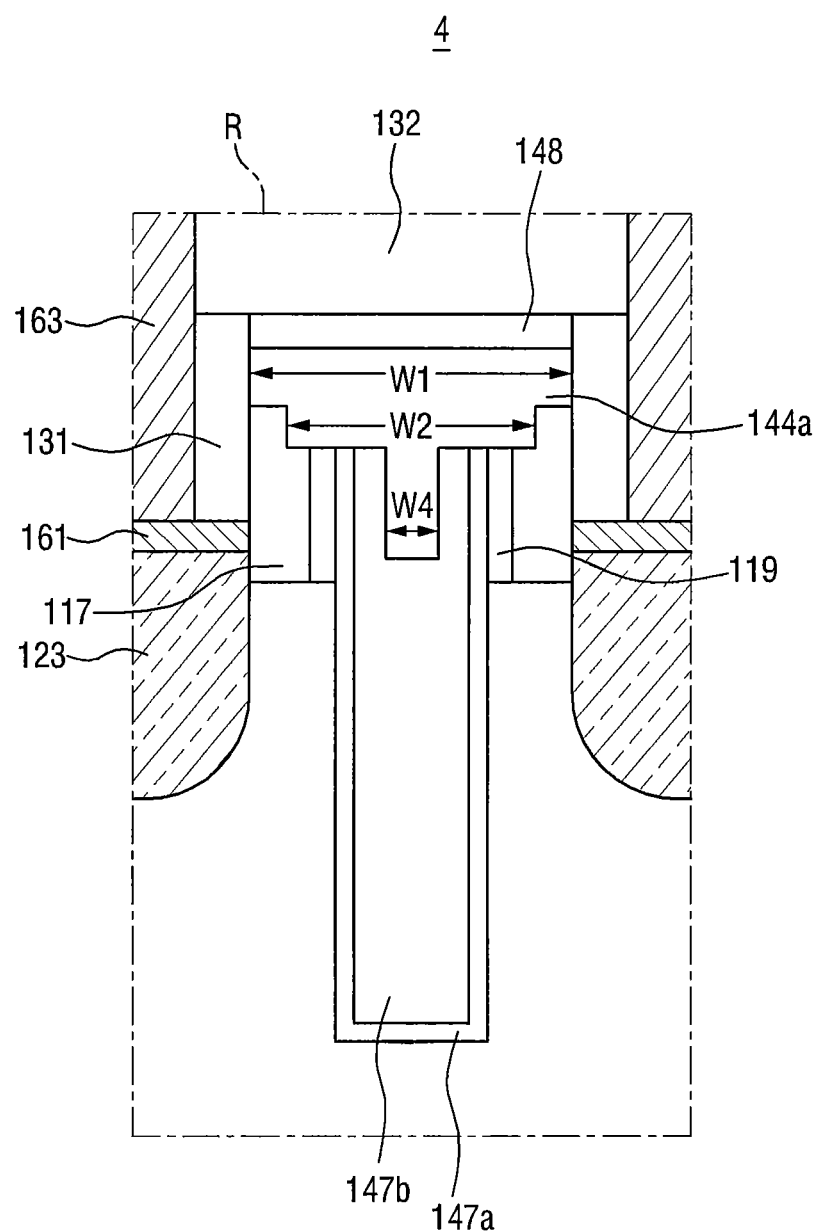
FIG. 8 is a cross-sectional view of a semiconductor device according to some embodiments of present inventive concepts.

FIG. 8 is a cross-sectional view of a semiconductor device 4 according to some embodiments of present inventive concepts. The following description may focus on differences between FIG. 8 and FIGS. 3, 6, 7.

Referring to FIG. 8, in the semiconductor device 4, first isolation layers 147a and 147b may include an oxide layer 147a and a nitride layer 147b.

As shown in FIG. 8, the oxide layer 147a may be formed to upwardly extend along lateral surfaces of the nitride layer 147b. The nitride layer 147b may fill a space formed by the oxide layer 147a.

The second isolation layer 144a may include an upper region, an intermediate region and a lower region. A width W1 of the upper region may be greater than a width W2 of the intermediate region, and the width W2 of the intermediate region may be greater than a width W4 of the lower region. As shown in FIG. 8, the lower region of the second isolation layer 144a may be formed on lateral surfaces of the nitride layer 147b. The first isolation layers 147a and 147b and the second isolation layer 144a may improve gap-fill capability.

Figure 9:
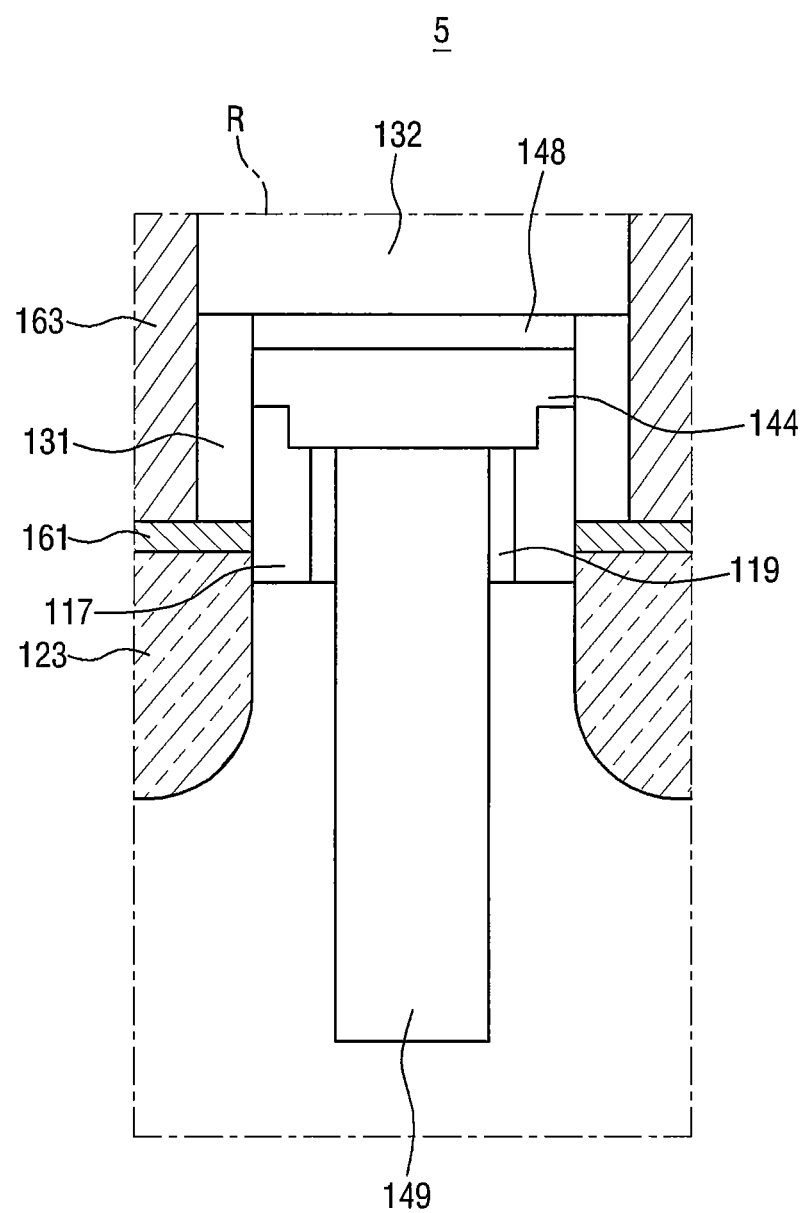
FIG. 9 is a cross-sectional view of a semiconductor device according to some embodiments of present inventive concepts.

FIG. 9 is a cross-sectional view of a semiconductor device 5 according to some embodiments of present inventive concepts. The following description may focus on differences between FIG. 9 and FIGS. 3, 6-8.

Referring to FIG. 9, in the semiconductor device 5, an entire first isolation layer 149 may include (e.g., may exclusively include) an oxide layer, unlike in semiconductor devices according to FIGS. 3 and 6-8. That is to say, in FIG. 9, the first isolation layer 149 and a second isolation layer 144 may include the same material. In this case, the first isolation layer 149 and the second isolation layer 144 may be formed as two different layers, as shown in FIG. 9. However, the first isolation layer 149 and the second isolation layer 144 may be formed in one body.

Figure 10:
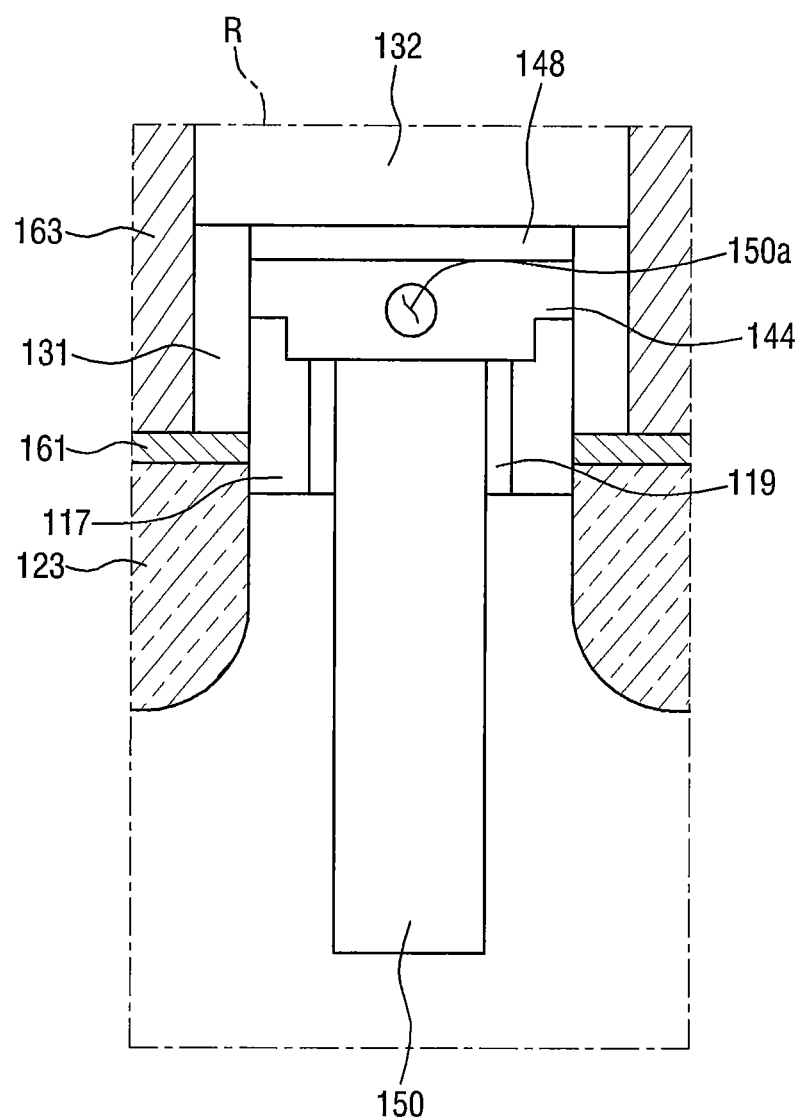
FIG. 10 is a cross-sectional view of a semiconductor device according to some embodiments of present inventive concepts.

FIG. 10 is a cross-sectional view of a semiconductor device 6 according to some embodiments of present inventive concepts. The following description may focus on differences between FIG. 10 and FIGS. 3, 6-9.

Referring to FIG. 10, in the semiconductor device 6, a second isolation layer 144 may include an air gap 150a. The air gap 150a may be formed by forming the second isolation layer 144 by using a method which has poor step coverage characteristic.

In such a manner, a device isolating characteristic of the second isolation layer 144 may be improved by forming the second isolation layer 144 including the air gap 150a.

In FIG. 10, the second isolation layer 144 including only the single air gap 150a is illustrated, but aspects of present inventive concepts are not limited thereto. In some embodiments of present inventive concepts, an air gap 150a may alternatively be formed in a first isolation layer 150.

In addition, in some embodiments of present inventive concepts, the air gap 150a may be formed in each of the first and second isolation layers 150 and 144, unlike in FIG. 10.

Although air gaps are discussed herein by way of example, any gap may be used according to various embodiments of the present disclosure. A gap may be defined, for example, as any void, cavity, or unobstructed space, and may be a gap filled with air (e.g., an air gap), a gap filled with an inert gas or gases (e.g., an inert gas gap), a gap defining a vacuum (e.g., a vacuum gap), etc.

Figure 11A:
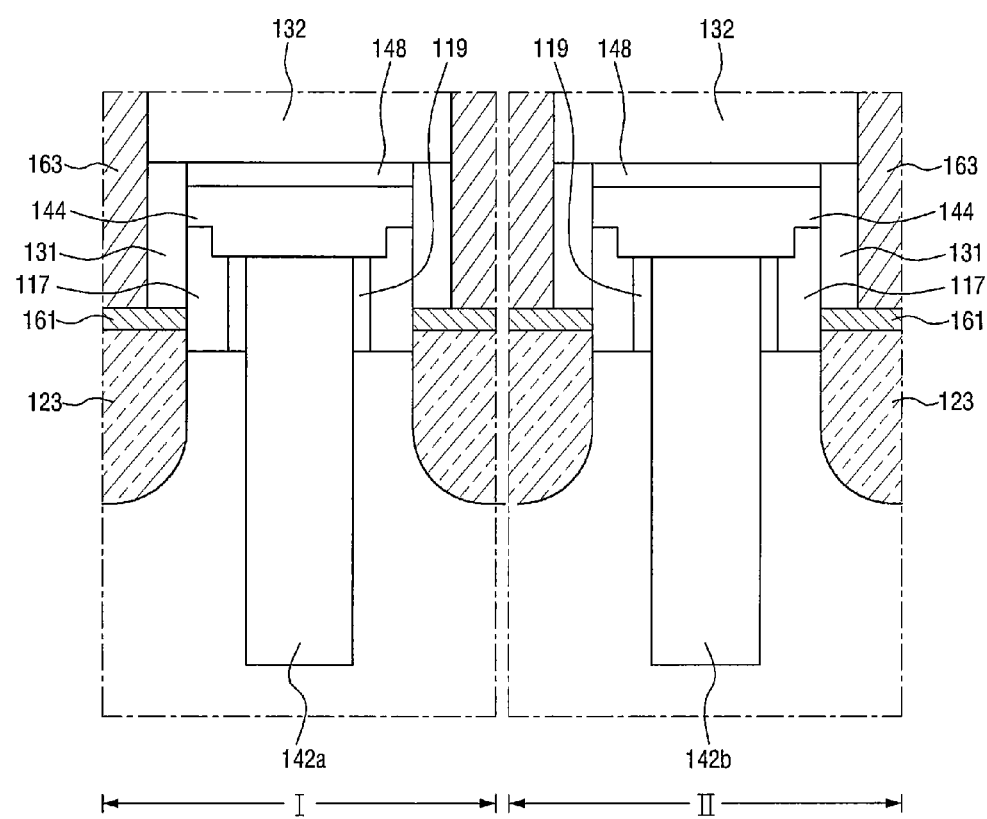
FIG. 11A is a cross-sectional view of a semiconductor device according to some embodiments of present inventive concepts.

FIG. 11A is a cross-sectional view of a semiconductor device 7 according to some embodiments of present inventive concepts. The following description may focus on differences between FIG. 11A and FIGS. 3, 6-10.

Referring to FIG. 11A, the semiconductor device 7 may include a first region I and a second region II. The first region I may be, for example, a PMOS region. In other words, PMOS transistors spaced apart from each other in the first direction X1 may be formed in the first region I.

A first isolation layer 142a formed in the first region I may include, for example, a tensile stress material. Since the first isolation layer 142a includes the tensile stress material, tensile stress may be applied to a channel region of a PMOS transistor formed to be adjacent to the first isolation layer 142a. Accordingly, characteristics of the PMOS transistor may be improved.

The second region II may be, for example, an NMOS region. In other words, NMOS transistors spaced apart from each other in the first direction X1 may be formed in the second region II.

A first isolation layer 142b formed in the second region II may include, for example, a compressive stress material. Since the first isolation layer 142b includes the compressive stress material, compressive stress may be applied to channel regions of an NMOS transistor formed to be adjacent to the first isolation layer 142b. Accordingly, characteristics of the NMOS transistor may be improved.

In some embodiments of present inventive concepts, the first isolation layer 142a formed in the first region I may include, for example, a silicon nitride layer having a relatively large lattice structure, and the second isolation layer 142b formed in the second region II may include, for example, a silicon nitride layer having a relatively small lattice structure, but aspects of present inventive concepts are not limited thereto.

Figure 11B:
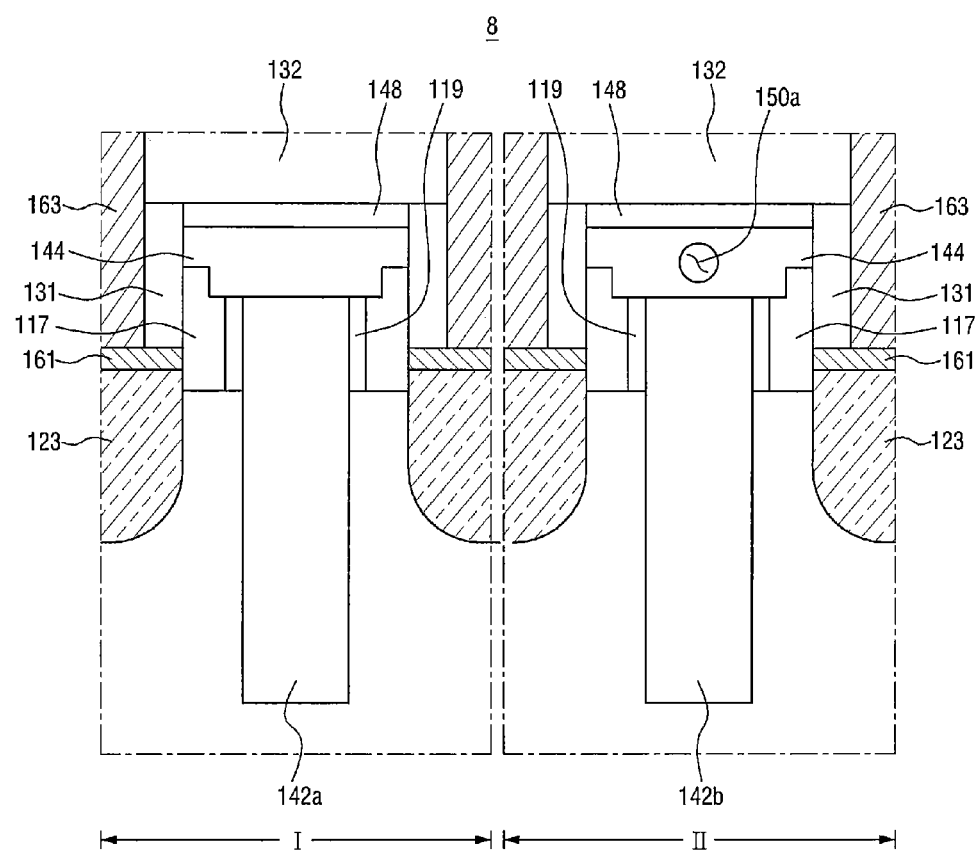
FIG. 11B is a cross-sectional view of a semiconductor device according to some embodiments of present inventive concepts.

FIG. 11B is a cross-sectional view of a semiconductor device 8 according to some embodiments of present inventive concepts. The following description may focus on differences between FIG. 11B and FIGS. 3, 6-11A.

Referring to FIG. 11B, in the semiconductor device 8, an air gap 150a is not present in a second isolation layer 144 formed in a first region I, while the air gap 150a may be present in the second isolation layer 144 formed in a second region II.

In other words, in some embodiments, the air gap 150a may be formed in the second isolation layer 144 of one of the first region I and the second region II, while the air gap 150a may not be formed in the second isolation layer 144 of the other of the first region I and the second region II.

In some embodiments of present inventive concepts, the first region I may be, for example, a PMOS region. In other words, PMOS transistors spaced apart from each other in the first direction X1 may be formed in the first region I. In addition, the second region II may be, for example, an NMOS region. In other words, NMOS transistors spaced apart from each other in the first direction X1 may be formed in the second region II.

Figure 12A:
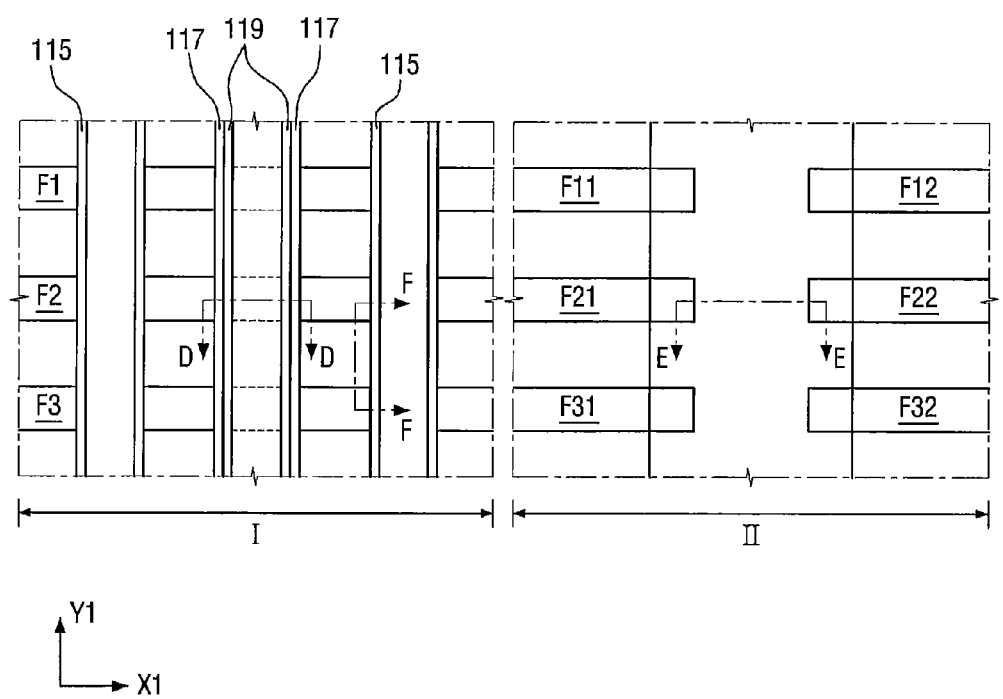
FIG. 12A is a layout view of a semiconductor device according to some embodiments of present inventive concepts.
Figure 12B:
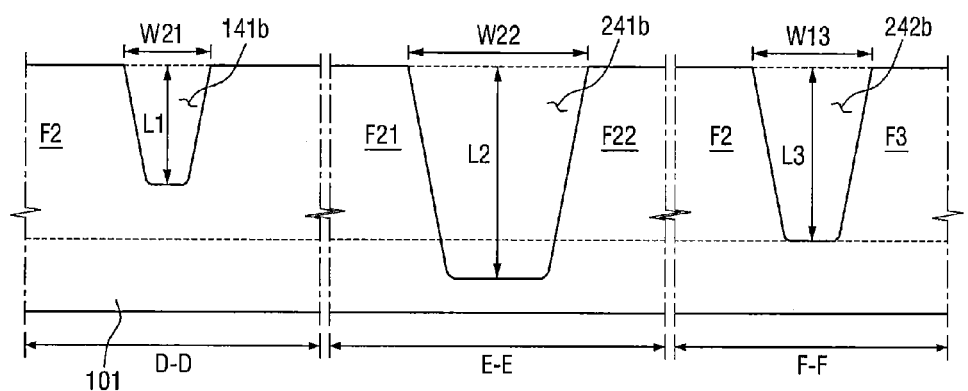
FIG. 12B is a cross-sectional view taken along lines D-D, E-E and F-F of FIG. 12A.

FIG. 12A is a layout view of a semiconductor device according to some embodiments of present inventive concepts, and FIG. 12B is a cross-sectional view taken along lines D-D, E-E and F-F of FIG. 12A. The following description may focus on differences between FIGS. 12A, 12B and FIGS. 1-11B.

For the sake of convenient explanation, in the semiconductor device shown in FIG. 12A, only first to third fins F1 to F3, normal spacers 115, dummy spacers 117, and inner spacers 119 are illustrated, like the semiconductor device 1 shown in FIGS. 1 to 5.

Referring to FIGS. 12A and 12B, a first region I and a second region II may be defined on a substrate 101.

In some embodiments, the first region I and the second region II may be spaced apart from each other or may be connected to each other. When the first region I and the second region II are connected to each other, first to third fins F1 to F3 may extend to form 11th to 31st fins F11 to F31. In other words, the first to third fins F1 to F3 and the 11th to 31st fins F11 to F31 may be formed in one body.

The first to third fins F1 to F3 may extend in the first direction X1 and may protrude from the substrate 101. First recesses 141b may be formed in the first to third fins F1 to F3, respectively. The first recesses 141b may extend in the second direction Y1. The first isolation layer (142 of FIG. 2) may be formed in the first recesses 141b.

The dummy spacers 117 and the inner spacers 119 extending in the second direction Y1 may be disposed in the first recesses 141b.

The normal spacers 115 may be disposed at opposite sides of the dummy spacers 117 and the inner spacers 119 to extend in the second direction Y1. Normal gate structures (151 of FIG. 2) may be formed between the normal spacers 115.

Some of 11th to 32nd fins, F11, F12, F21, F22, F31 and F32, may be formed in the second region II and may protrude from the substrate 101. The 11th and 12th fins F11 and F12 may be aligned to extend in the first direction X1 and may be spaced apart from each other by a second recess 241b.

The 21st and 22nd fins F21 and F22 may be aligned to extend in the first direction X1 and may be spaced apart from each other by the second recess 241b.

The 31st and 32nd fins F31 and F32 may be aligned to extend in the first direction X1 and may be spaced apart from each other by the second recess 241b.

The 11th, 21st and 31st fins F11, F21 and F31 may be spaced apart from each other in the second direction Y1, and the 12th, 22nd and 32nd fins F12, F22 and F32 may be spaced apart from each other in the second direction Y1.

The second recess 241b may extend in the second direction Y1. An insulation layer may be formed in the second recess 241b. The insulation layer formed in the second recess 241b may be, for example, a deep trench isolation (DTI) layer.

A height L1 of the first recess 141b may be smaller/shorter than a height L2 of the second recess 241b, and a width W21 of the first recess 141b may be smaller/narrower than a width W22 of the second recess 241b.

Third recesses 242b may be formed between the first fin F1 and the second fin F2 and between the second fin F2 and the third fin F3 to extend in the first direction X1. In addition, the third recesses 242b may also be formed between the 11th fin F11 and the 21st fin F21 and between the 21st fin F21 and the 31st fin F31 to extend in the first direction X1. In addition, the third recesses 242b may also be formed between the 12th fin F12 and the 22nd fin F22 and between the 22nd fin F22 and the 32nd fin F32 to extend in the first direction X1.

An insulation layer may be formed in each of the third recesses 242b. The insulation layer formed in the third recess 242b may be, for example, a shallow trench isolation (STI) layer.

A height L3 of the third recess 242b may be greater (e.g., taller/longer) than the height L1 of the first recess 141b and smaller/shorter than the height L2 of the second recess 241b. The second recess 241b may be formed by etching a portion of the substrate 101. A width W13 of the third recess 242b may be wider than a width W21 of the first recess 141b and narrower than a width W22 of the second recess 241b.

Among the height L1 of the first recess 141b, the height L3 of the third recess 242b and the height L2 of the second recess 241b, the height L1 of the first recess 141b may be the smallest/shortest, and the height L2 of the second recess 241b may be largest (e.g., tallest/longest).

The first region I and the second region II may be defined according to the arrangement and operations of semiconductor devices. For example, the first region I may be a memory region and the second region II may be a core/peripheral region.

As an example, the first region I may be a Static Random Access Memory (SRAM) region and the second region II may be a logic region, but aspects of present inventive concepts are not limited thereto. In some embodiments, the second region II may be a logic region and the first region I may be a region where other memories, for example, Dynamic Random Access Memory (DRAM), Magnetoresistive Random Access Memory (MRAM), Resistive Random Access Memory (RRAM), Phase-Change Random Access Memory (PRAM), etc. are formed.

Figure 12C:
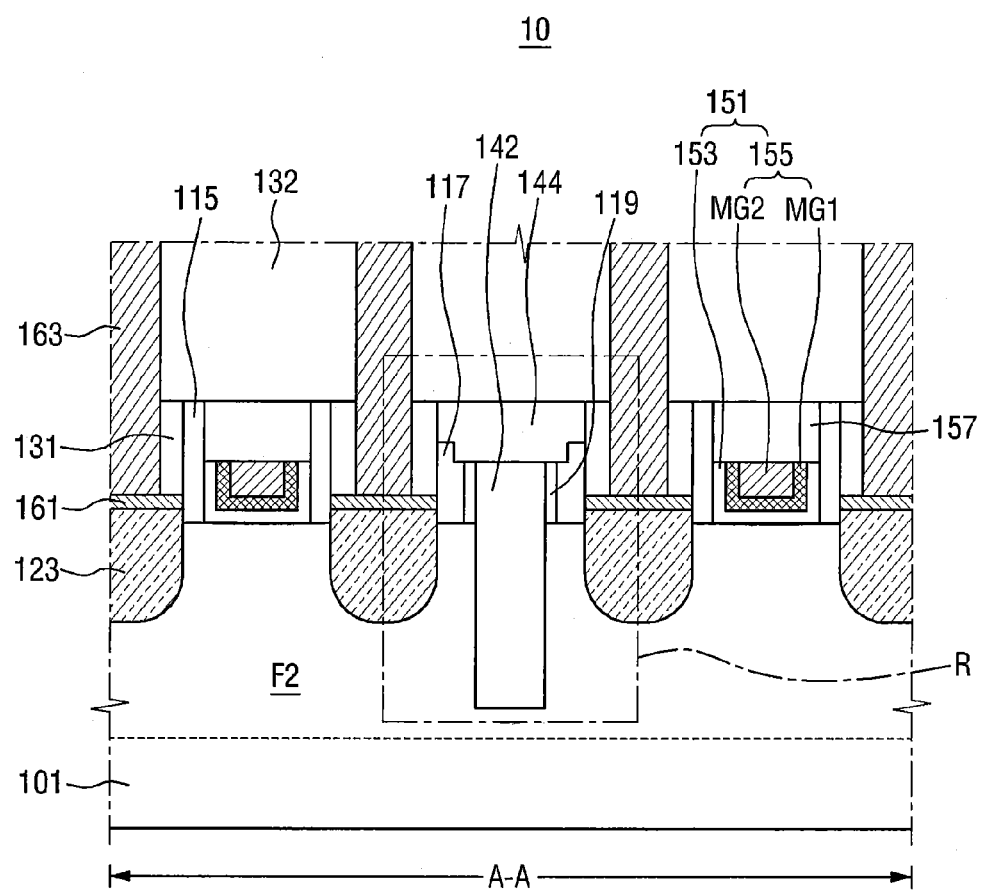
FIG. 12C is a cross-sectional view of a semiconductor device according to some embodiments of present inventive concepts.

FIG. 12C is a cross-sectional view of a semiconductor device 10 according to some embodiments of present inventive concepts. The following description may focus on differences between FIG. 12C and FIG. 2.

Referring to FIG. 12C, in the semiconductor device 10 according to present inventive concepts, a protection layer (148 of FIG. 2) may be omitted/removed from a second isolation layer 144. In some embodiments, the protection layer (148 of FIG. 2) may be removed by a gate replacement process while normal gate structures 151 are formed.

In some embodiments, a top surface of the gate capping layer 157, a top surface of the second isolation layer 144 and top surfaces of the normal spacers 115 may be coplanar. In other words, a height of the top surface of the gate capping layer 157, a height of the top surface of the second isolation layer 144 and heights of the top surfaces of the normal spacers 115 may be substantially equal to each other.

Figure 13A:
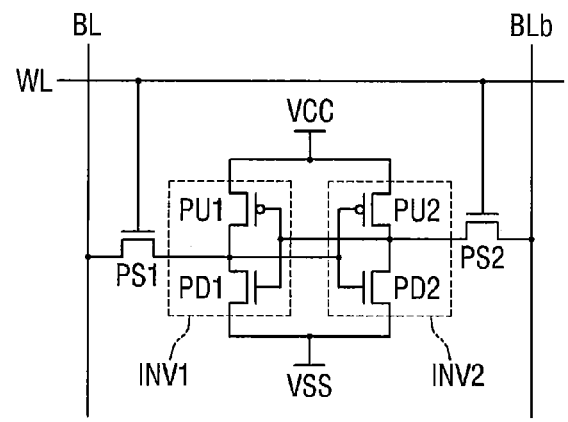
FIG. 13A is a circuit view for explaining semiconductor devices according to some embodiments of present inventive concepts.
Figure 13B:
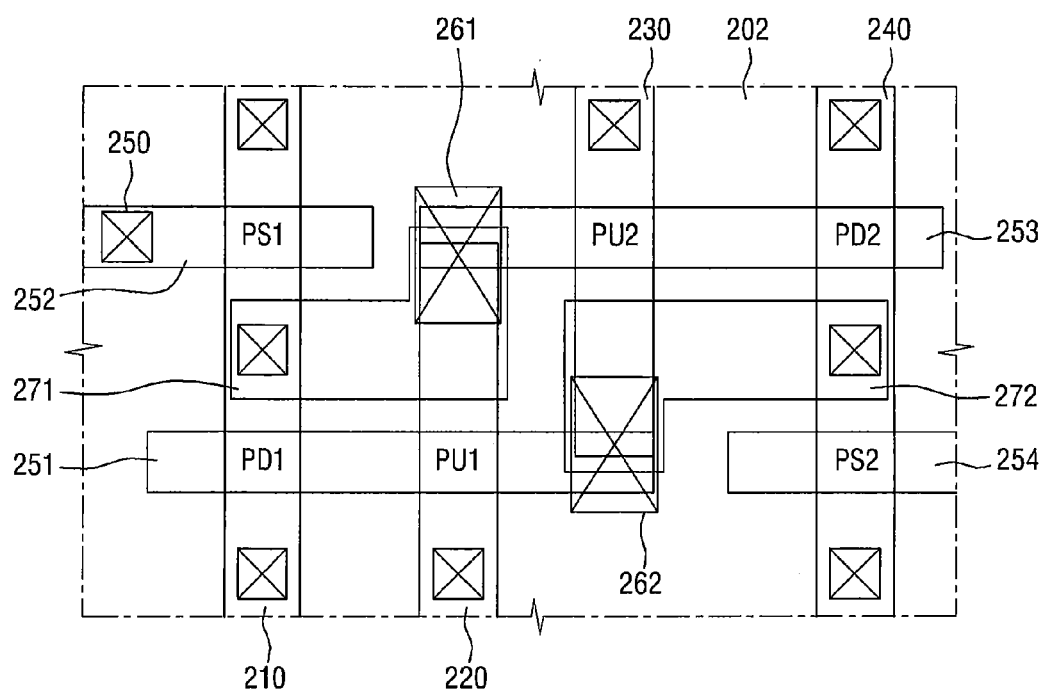
FIG. 13B is a layout view of the semiconductor device shown in FIG. 13A.

FIG. 13A is a circuit view for explaining semiconductor devices according to some embodiments of present inventive concepts and FIG. 13B is a layout view of the semiconductor device shown in FIG. 13A. The following description may focus on differences between FIGS. 13A/13B and FIGS. 1-12C.

Referring first to FIG. 13A, the semiconductor device may include a pair of inverters INV1 and INV2 connected in parallel between a power supply node VCC and a ground node VSS, and a first pass transistor PS1 and a second pass transistor PS2 connected to output nodes of the inverters INV1 and INV2. The first pass transistor PS1 and the second pass transistor PS2 may be connected to a bit line BL and a complementary bit line BLb. Gates of the first pass transistor PS1 and the second pass transistor PS2 may be connected to a word line WL.

The first inverter INV1 includes a first pull-up transistor PU1 and a first pull-down transistor PD1 connected in series to each other, and the second inverter INV2 includes a second pull-up transistor PU2 and a second pull-down transistor PD2 connected in series to each other. The first pull-up transistor PU1 and the second pull-up transistor PU2 may be PFET transistors, and the first pull-down transistor PD1 and the second pull-down transistor PD2 may be NFET transistors.

In addition, to constitute a latch circuit, an input node of the first inverter INV1 is connected to an output node of the second inverter INV2 and an input node of the second inverter INV2 is connected to an output node of the first inverter INV1.

Referring to FIGS. 13A and 13B, a first active fin 210, a second active fin 220, a third active fin 230 and a fourth active fin 240, which are spaced apart from one another, may extend lengthwise in one direction (for example, in an up-down direction of FIG. 13B). Here, the second active fin 220 and the third active fin 230 may extend in smaller/shorter lengths than the first active fin 210 and the fourth active fin 240.

In addition, a first gate electrode 251, a second gate electrode 252, a third gate electrode 253, and a fourth gate electrode 254 are formed to extend lengthwise in the other direction (for example, in a left-right direction of FIG. 13B) to intersect the first active fin 210 to the fourth active fin 240.

In detail, the first gate electrode 251 completely intersects the first active fin 210 and the second active fin 220 while partially overlapping with a terminal of the third active fin 230. The third gate electrode 253 completely intersects the fourth active fin 240 and the third active fin 230 while partially overlapping with a terminal of the second active fin 220. The second gate electrode 252 and the fourth gate electrode 254 are formed to intersect the first active fin 210 and the fourth active fin 240, respectively.

As shown, the first pull-up transistor PU1 is defined in the vicinity of an intersection of the first gate electrode 251 and the second active fin 220, the first pull-down transistor PD1 is defined in the vicinity of an intersection of the first gate electrode 251 and the first active fin 210, and the first pass transistor PS1 is defined in the vicinity of an intersection of the second gate electrode 252 and the first active fin 210. The second pull-up transistor PU2 is defined in the vicinity of an intersection of the third gate electrode 253 and the third active fin 230, the second pull-down transistor PD2 is defined in the vicinity of an intersection of the third gate electrode 253 and the fourth active fin 240, and the second pass transistor PS2 is defined in the vicinity of an intersection of the fourth gate electrode 254 and the fourth active fin 240.

Sources and drains may be formed at opposite sides of the respective intersections of the first to fourth gate electrodes 251-254 and the first to fourth active fins 210, 220, 230 and 240, and a plurality of contacts 250 may be formed.

Further, a first shared contact 261 may simultaneously connect the second active fin 220, the third gate electrode 253, and a wiring 271 with one another. A second shared contact 262 may simultaneously connect the third active fin 230, the first gate electrode 251 and a wiring 272 with one another.

At least one of the semiconductor devices according to some embodiments of present inventive concepts can be employed as the semiconductor device of FIGS. 13A/13B.

For example, at least one of the semiconductor devices 1-10 according to some embodiments of present inventive concepts can be employed as a component for isolating the first pass transistor PS1 and the first pull-down transistor PD1 from each other or for isolating the second pass transistor PS2 and the second pull-down transistor PD2 from each other.

In addition, to constitute the first and second pull-down transistors PD1 and PD2 and the first and second pull-down transistors PD1 and PD2, the semiconductor devices 1-10 according to some embodiments of present inventive concepts can be used.

Figure 14:
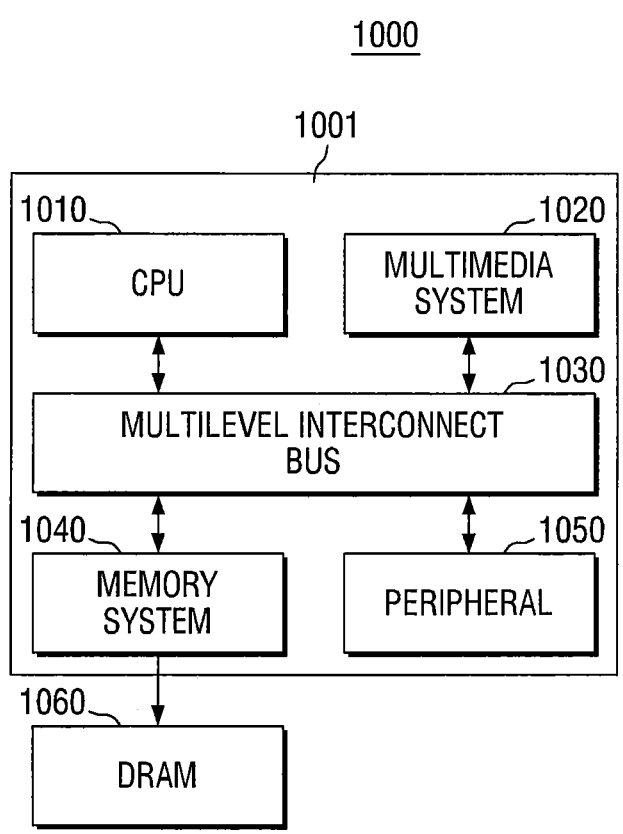
FIG. 14 is a block diagram of an SoC system including semiconductor devices according to some embodiments of present inventive concepts.

FIG. 14 is a block diagram of a System on Chip (SoC) system including semiconductor devices according to some embodiments of present inventive concepts.

Referring to FIG. 14, the SoC system 1000 may include an application processor (AP) 1001 and a DRAM 1060.

The application processor 1001 may include a central processing unit (CPU) 1010, a multimedia system 1020, a bus 1030, a memory system 1040, and a peripheral circuit 1050.

The central processing unit 1010 may perform operations necessary for operating the SoC system 1000. In some embodiments of present inventive concepts, the central processing unit 1010 may be configured in a multi-core environment including a plurality of cores.

The multimedia system 1020 may be used in performing a variety of multimedia functions in the SoC system 1000. The multimedia system 1020 may include a 3D engine module, a video codec, a display system, a camera system, and a post-processor.

The bus 1030 may be used in performing data communication among the central processing unit 1010, the multimedia system 1020, the memory system 1040, and the peripheral circuit 1050. In some embodiments of present inventive concepts, the bus 1030 may have a multi-layered structure. In detail, examples of the bus 1030 may include a multi-layer advanced high-performance bus (AHB), or a multi-layer advanced eXtensible interface (AXI), but aspects of present inventive concepts are not limited thereto.

The memory system 1040 may provide environments necessary for high-speed operation by connecting the AP 1001 to an external memory (for example, the DRAM 1060). In some embodiments of present inventive concepts, the memory system 1040 may include a separate controller (for example, a DRAM controller) for controlling the external memory (for example, the DRAM 1060).

The peripheral circuit 1050 may provide environments necessary for smoothly connecting the SoC system 1000 to an external device (for example, a main board). Accordingly, the peripheral circuit 1050 may include various kinds of interfaces enabling the external device connected to the SoC system 1000 to be compatibly used.

The DRAM 1060 may function as a working memory required to operate the AP 1001. In some embodiments of present inventive concepts, as shown, the DRAM 1060 may be disposed outside the AP 1001. In detail, the DRAM 1060 may be packaged with the AP 1001 in the form of a package on package (PoP).

At least one of the components of the SoC system 1000 may employ one of the aforementioned semiconductor devices 1-10 according to some embodiments of present inventive concepts.

Figure 15:
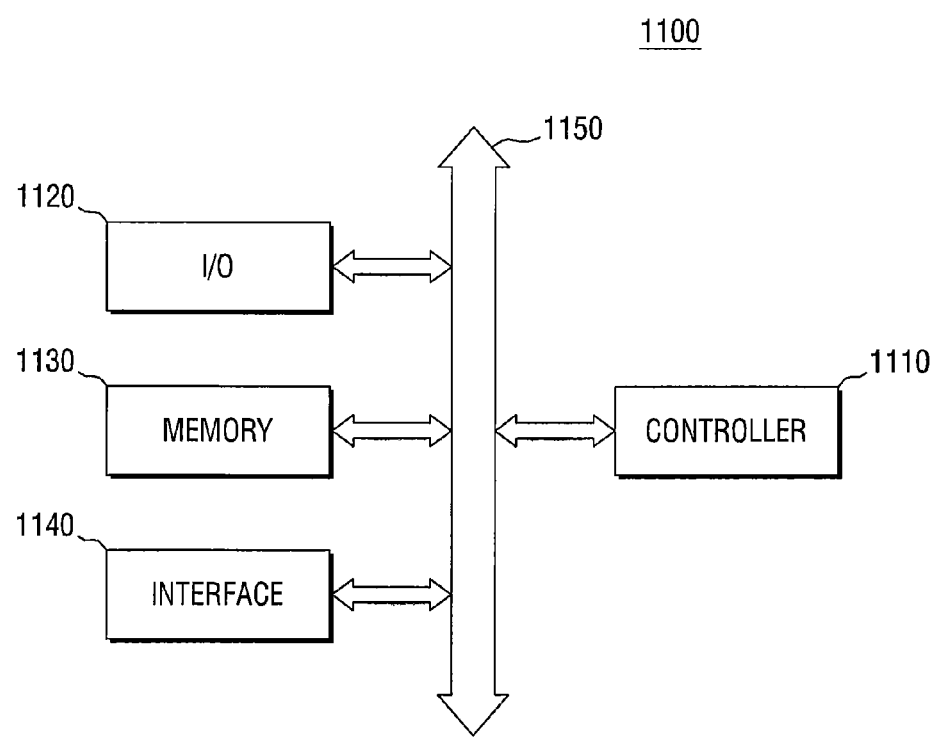
FIG. 15 is a block diagram of an electronic system including semiconductor devices according to some embodiments of present inventive concepts.

FIG. 15 is a block diagram of an electronic system including semiconductor devices according to some embodiments of present inventive concepts.

Referring to FIG. 15, the electronic system 1100 may include a controller 1110, an input/output device (I/O) 1120, a memory device 1130, an interface 1140 and a bus 1150. The controller 1110, the I/O 1120, the memory device 1130, and/or the interface 1140 may be connected to each other through the bus 1150. The bus 1150 corresponds to a path through which data moves.

The controller 1110 may include at least one of a microprocessor, a digital signal processor, a microcontroller, and logic elements capable of functions similar to those of these elements. The I/O 1120 may include a key pad, a key board, a display device, and so on. The memory device 1130 may store data and/or commands. The interface 1140 may perform functions of transmitting data to a communication network or receiving data from the communication network. The interface 1140 may be wired or wireless. For example, the interface 1140 may include an antenna or a wired/wireless transceiver, and so on.

The electronic system 1100 may further include high-speed DRAM and/or SRAM as the working memory for improving the operation of the controller 1110. Here, a semiconductor device 1-10 according to some embodiments of present inventive concepts may be employed as the working memory. In addition, the semiconductor device according to some embodiments of present inventive concepts may be provided in the memory device 1130 or may be provided in some components of the controller 1110 or the I/O 1120.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 16:
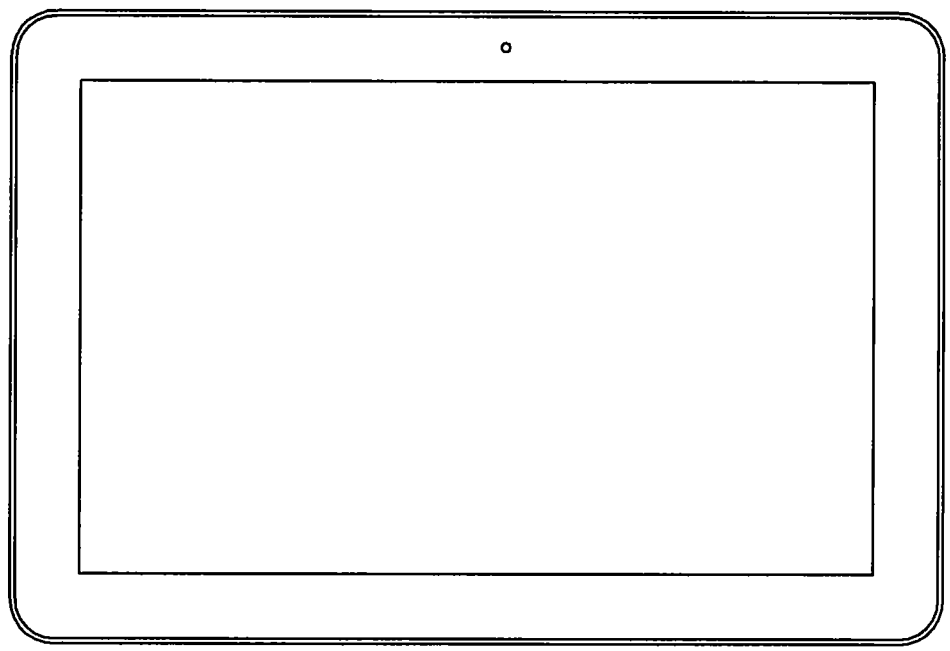
FIGS. 16 to 18 illustrate examples of semiconductor systems to which semiconductor devices according to some embodiments of present inventive concepts can be applied.
Figure 17:
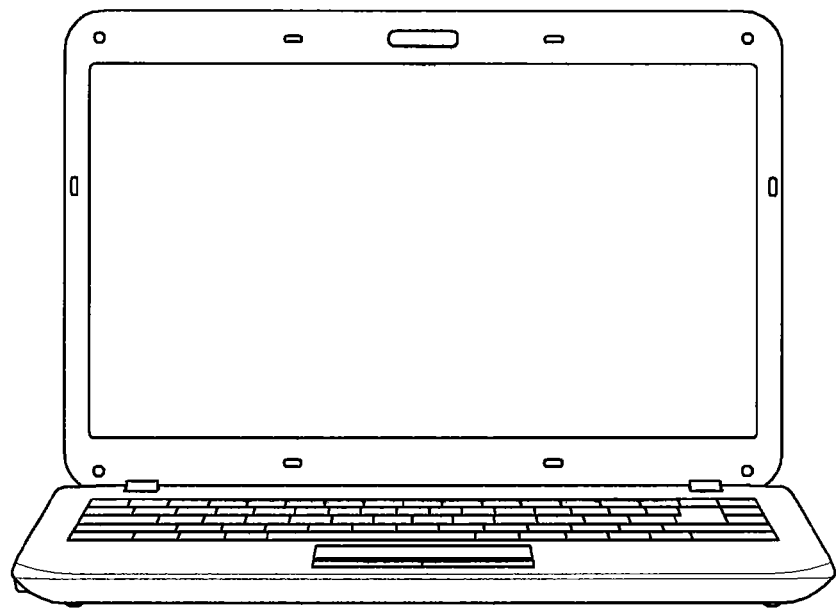
Figure 18:
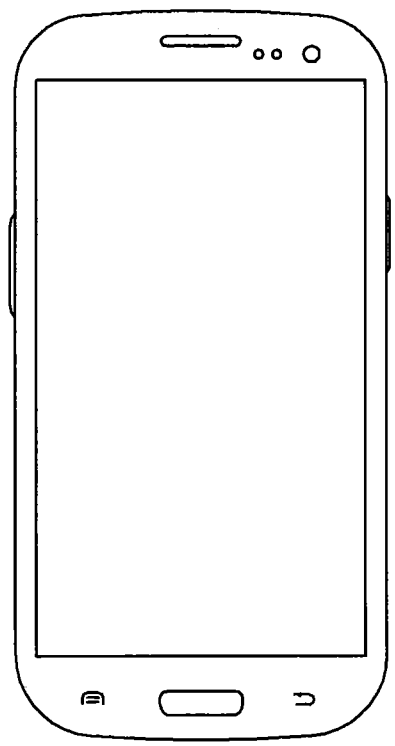

FIGS. 16 to 18 illustrate examples of semiconductor systems to which semiconductor devices according to some embodiments of present inventive concepts can be applied.

FIG. 16 illustrates an example in which a semiconductor device according to some embodiments of present inventive concepts is applied to a tablet computer (e.g., a tablet Personal Computer (PC)) 1200, FIG. 17 illustrates an example in which a semiconductor device according to some embodiments of present inventive concepts is applied to a notebook computer 1300, and FIG. 18 illustrates an example in which a semiconductor device according to some embodiments of present inventive concepts is applied to a smart phone 1400. At least one of the semiconductor devices 1-10 according to some embodiments of present inventive concepts can be employed to (e.g., used in) a tablet computer 1200, a notebook computer 1300, a smart phone 1400, and the like.

In addition, the semiconductor devices according to some embodiments of present inventive concepts may also be applied to other Integrated Circuit (IC) devices. That is to say, in the above-described embodiments, although only the tablet computer 1200, the notebook computer 1300 and the smart phone 1400 have been illustrated as examples of the semiconductor devices according to some embodiments of present inventive concepts, aspects of present inventive concepts are not limited thereto. In some embodiments of present inventive concepts, the semiconductor device may be implemented as a computer, an ultra mobile personal computer (UMPC), a work station, a net-book, a personal digital assistant (PDA), a portable computer, a web tablet, a wireless phone, a mobile phone, a smart phone, an e-book, a portable multimedia player (PMP), a portable game console, a navigation device, a digital camera, a 3-dimensional (3D) television, a digital audio recorder, a digital audio player, a digital picture recorder, a digital picture player, a digital video recorder, a digital video player, or the like.

FIGS. 19 to 30 are diagrams illustrating intermediate process steps for explaining a method for fabricating semiconductor devices according to some embodiments of present inventive concepts.

Figure 19:
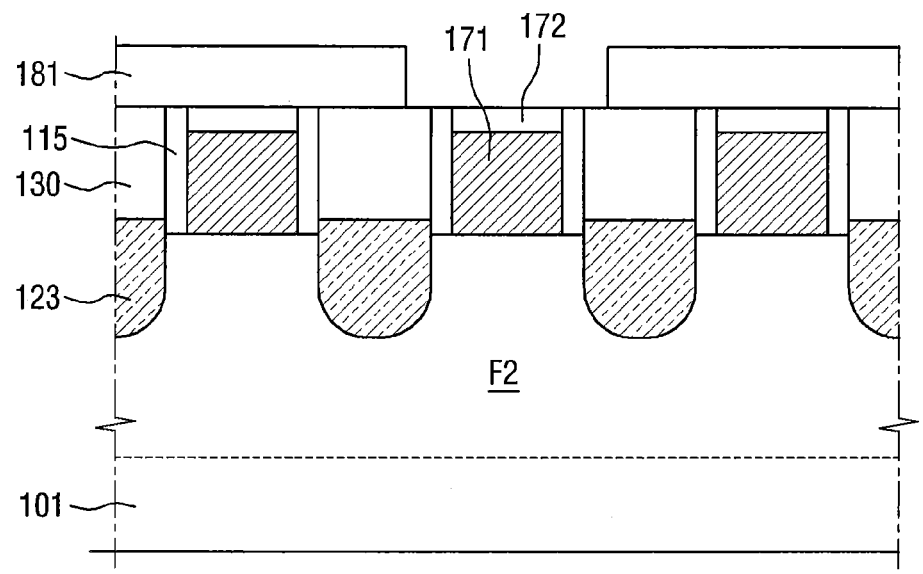
FIGS. 19 to 30 are diagrams illustrating intermediate process steps for explaining a method for fabricating semiconductor devices according to some embodiments of present inventive concepts.

First, referring to FIG. 19, a fin F2 is formed on a substrate 101. The fin F2 may extend in a first direction (X1 of FIG. 1) and may protrude from the substrate 101. The fin F2 may be a portion of the substrate 101 and/or may include an epitaxial layer grown from the substrate 101. The fin F2 may include, for example, Si or SiGe.

Next, dummy gate electrodes 171 extending in a second direction (Y1 of FIG. 1) are formed on the fin F2. The dummy gate electrodes 171 may be spaced apart from each other in the first direction (X1 of FIG. 1).

The dummy gate electrodes 171 may include, for example, silicon, but aspects of present inventive concepts are not limited thereto.

Next, hard mask layers 172 are formed on the dummy gate electrodes 171. The hard mask layers 172 may include, for example, a nitride layer. In detail, the hard mask layers 172 may include, for example, a silicon nitride layer, but aspects of present inventive concepts are not limited thereto.

Next, normal spacers 115 are formed at opposite sidewalls of the dummy gate electrodes 171. While the normal spacers 115 are formed, top surfaces of the hard mask layers 172 may be exposed. The normal spacers 115 may include, for example, a nitride layer. In detail, the normal spacers 115 may include, for example, a silicon nitride layer, but aspects of present inventive concepts are not limited thereto.

Next, the fin F2 is etched. In detail, the top surface of the fin F2 exposed by the normal spacers 115 and the hard mask layers 172 are etched.

Next, source/drain regions 123 are formed on/in the etched top surface of the fin F2. The source/drain regions 123 may be elevated source/drain regions. Therefore, top surfaces of the source/drain regions 123 may be positioned higher than the top surface of the fin F2.

When a semiconductor device is a PMOS transistor, the source/drain regions 123 may include a compressive stress material. For example, the compressive stress material may be a material having a larger lattice constant than Si (e.g., SiGe).

Conversely, when a semiconductor device is an NMOS transistor, the source/drain regions 123 may include the same material as the substrate 101 or a tensile stress material. For example, when the substrate 101 includes Si, the source/drain regions 123 may include Si or a material having a smaller lattice constant than Si (e.g., Silicon Carbide (SiC) or Silicon Phosphide (SiP)).

The source/drain regions 123 may be formed by epitaxial growth, but aspects of present inventive concepts are not limited thereto. Alternatively, the source/drain regions 123 may be formed by ion implantation or impurity diffusion.

Next, a third interlayer insulation layer 130 covering the source/drain regions 123 is formed. The third interlayer insulation layer 130 may cover sidewalls of the normal spacers 115 while exposing the top surfaces of the hard mask layers 172. The third interlayer insulation layer 130 may include, for example, an oxide layer.

Next, a mask 181 exposing some portions of a plurality of dummy gate electrodes 171 is formed. As shown, the mask 181 may expose top surfaces of some of the plurality of normal spacers 115 and top surfaces of some of the hard mask layers 172 among the plurality of dummy gate electrodes 171 and the hard mask layers 172. The mask 181 may include, for example, an oxide layer.

Figure 20:
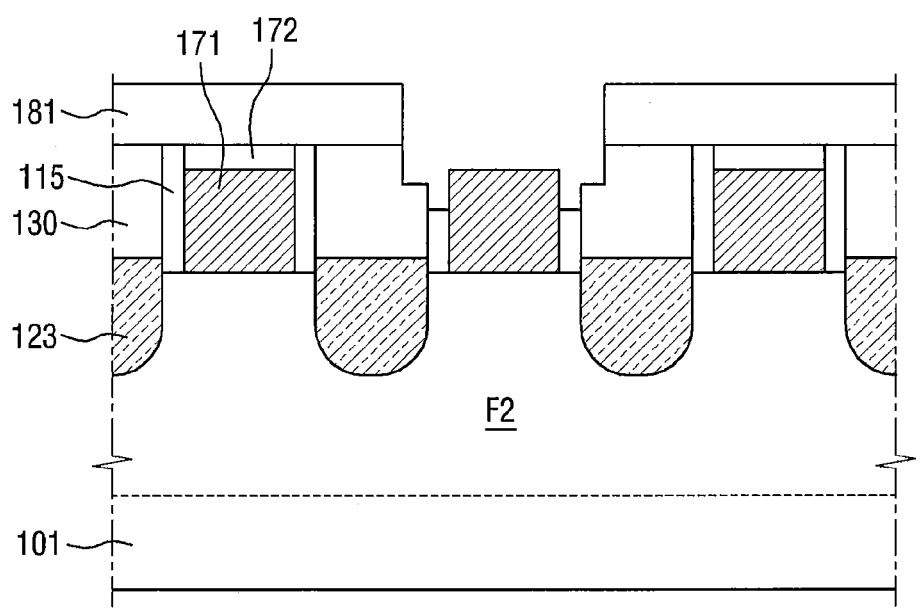

Referring to FIG. 20, the hard mask layers 172 having the exposed top surfaces may be removed by, for example, an etch back process. Here, when the hard mask layers 172 and the normal spacers 115 are formed of layers including the same material, that is, nitride layers, some of the top portions of the normal spacers 115 having the exposed top surfaces may also be removed at the same time when the hard mask layers 172 having the exposed top surfaces are removed. In addition, as shown in FIG. 20, a portion of the third interlayer insulation layer 130 having an exposed top surface may also be removed together with the hard mask layer 172 and the portions of the spacers 115.

Figure 21:
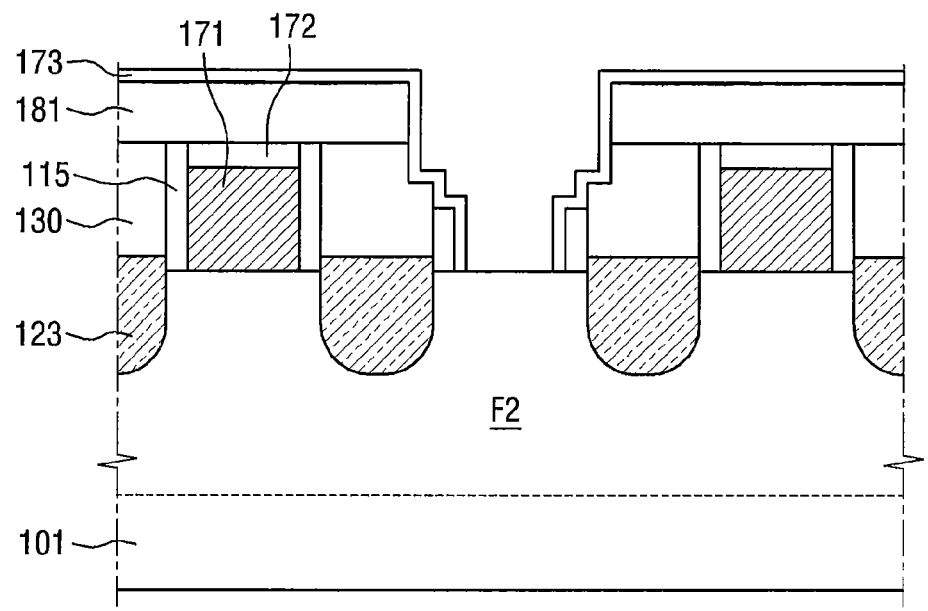

Next, referring to FIG. 21, the dummy gate electrodes 171 having the exposed top surfaces are removed. Accordingly, a portion of the top surface of the fin F2 may be exposed.

Next, an oxide layer 173 is formed on the substrate 101 by, for example, atomic layer deposition (ALD). The thus formed oxide layer 173 may cover the exposed top surface of the fin F2 and the top surfaces and lateral surfaces of the normal spacers 115 having partially etched top portions.

Figure 22:
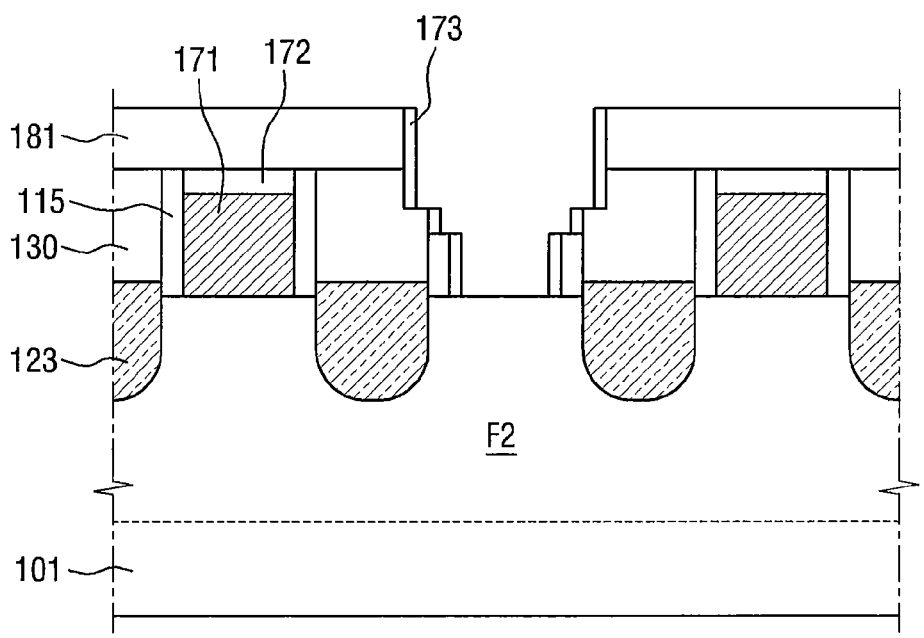

Next, referring to FIG. 22, the oxide layer 173 is anisotropically etched. Accordingly, the top surface of the fin F2 and portions of the top surfaces of normal spacers 115 having partially etched top portions may be etched.

Figure 23:
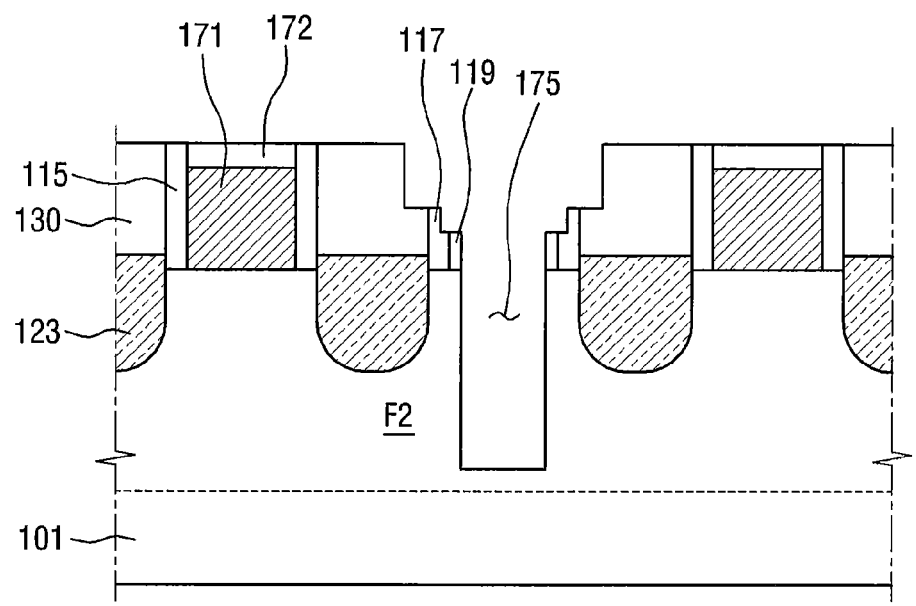

Referring to FIG. 23, the fin F2, the oxide layer 173 and the normal spacers 115 having partially etched top portions are etched using an etchant capable of etching a semiconductor material, an oxide layer and a nitride layer with predetermined selectivity.

Accordingly, the fin F2 is etched to form the trench 175, a top portion of the oxide layer 173 is partially etched to form the inner spacers 119, and portions of top portions of the normal spacers 115 are etched to form the dummy spacers 117. During this process, the mask 181 may also be removed.

In FIG. 23, the trench 175 formed in the fin F2 is formed to be spaced apart from source/drain regions 123 adjacent thereto due to presence of the inner spacers 119. Therefore, the adjacent source/drain regions 123 may not be damaged during the forming of the trench 175.

Figure 24:
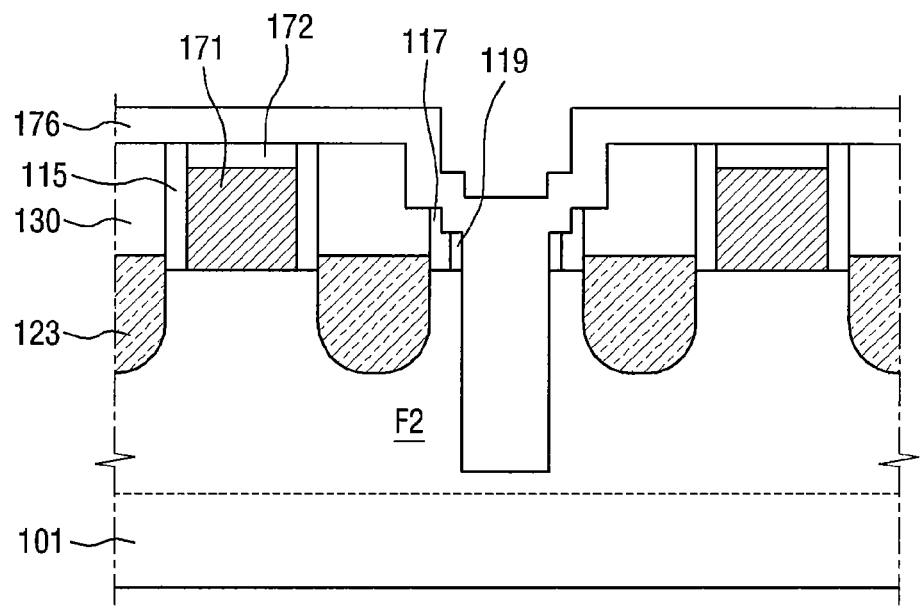

Next, referring to FIG. 24, a nitride layer 176 filling a trench (175 of FIG. 23) is formed by, for example, ALD. Next, referring to FIG. 25, the nitride layer 176 is etched to form a first isolation layer 142. Then, a second isolation layer 144 including, for example, an oxide layer and having the same height as the normal spacers 115, is formed on the first isolation layer 142.

Figure 25:
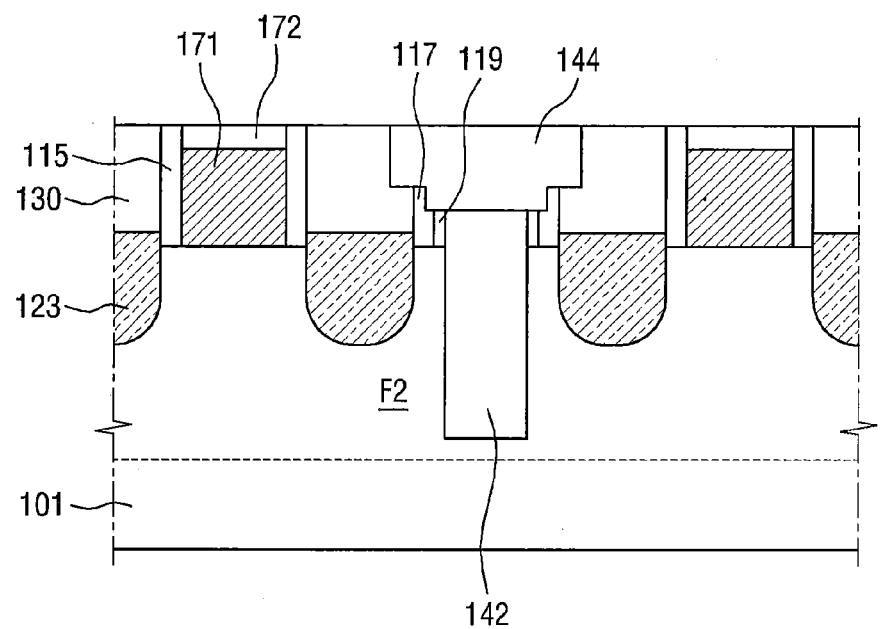

In FIG. 25, because the first and second isolation layers 142 and 144 having different widths are sequentially formed, a gap-fill capability of the isolation layers 142 and 144 may be improved.

Figure 26:
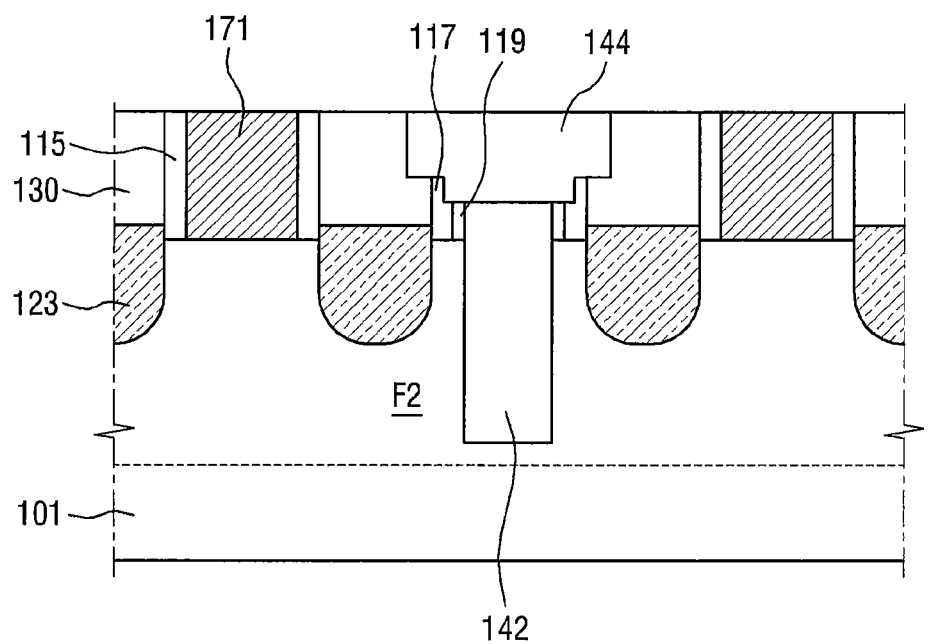

Referring to FIG. 26, the exposed hard mask layers 172 are removed. Then, the third interlayer insulation layer 130 and the second isolation layer 144 are planarized.

Figure 27:
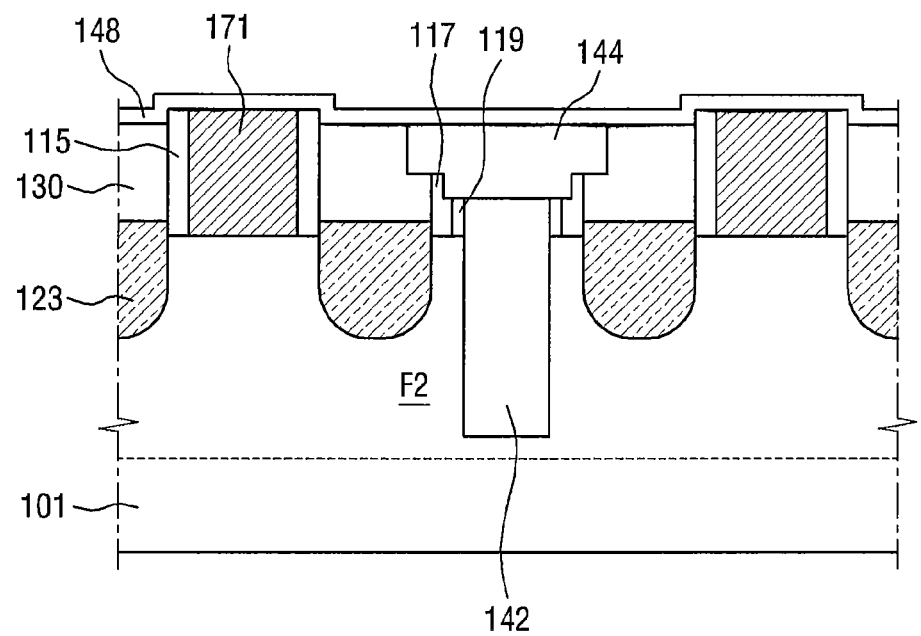

Referring to FIG. 27, the third interlayer insulation layer 130 and the second isolation layer 144 are etched to make the third interlayer insulation layer 130 and the second isolation layer 144 have smaller top surface heights than the normal spacers 115 and the dummy gate electrodes 171. Then, a protection layer 148 is formed on the third interlayer insulation layer 130, the normal spacers 115, the dummy gate electrodes 171 and the second isolation layer 144.

In some embodiments of present inventive concepts, the protection layer 148 may include, for example, a nitride layer.

Figure 28:
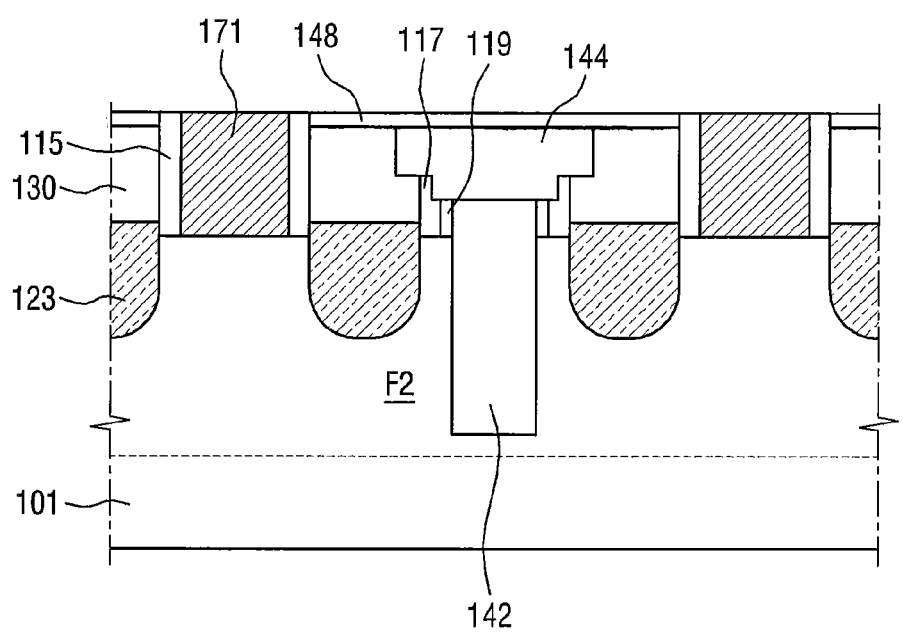

Next, referring to FIG. 28, the protection layer 148 is planarized. Accordingly, top surfaces of the dummy gate electrodes 171 may be exposed.

Thereafter, the exposed dummy gate electrodes 171 are replaced with normal gate structures (151 of FIG. 2), a gate capping layer (157 of FIG. 2) is formed on the normal gate structures (151 of FIG. 2), and a silicide layer 161 and a contact 163 are then formed at opposite sides of the normal gate structures (151 of FIG. 2), thereby fabricating semiconductor devices according to the above-described embodiments of present inventive concepts.

The protection layer 148 may protect underlying oxide layers (for example, the third interlayer insulation layer 130, the second isolation layer 144, etc.) during the replacing of the exposed dummy gate electrodes 171 with the normal gate structures (151 of FIG. 2).

Figure 29:
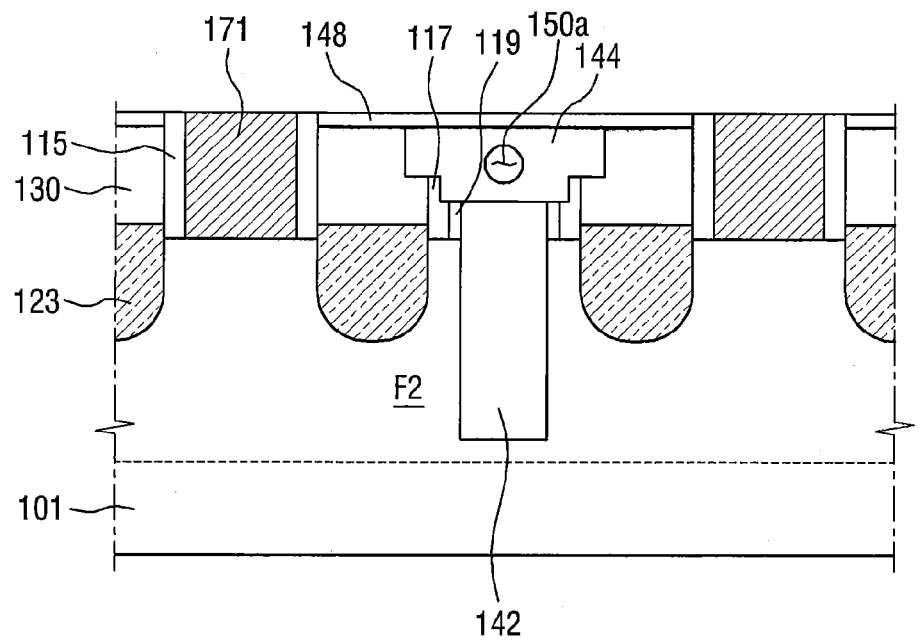

Meanwhile, when the second isolation layer 144 is formed by using a method that has poor step coverage characteristic during the process of forming the second isolation layer 144 shown in FIG. 25, an air gap 150a may be formed in the second isolation layer 144, as shown in FIG. 29. The air gap 150a formed in the second isolation layer 144 may improve a device isolation characteristic.

Figure 30:
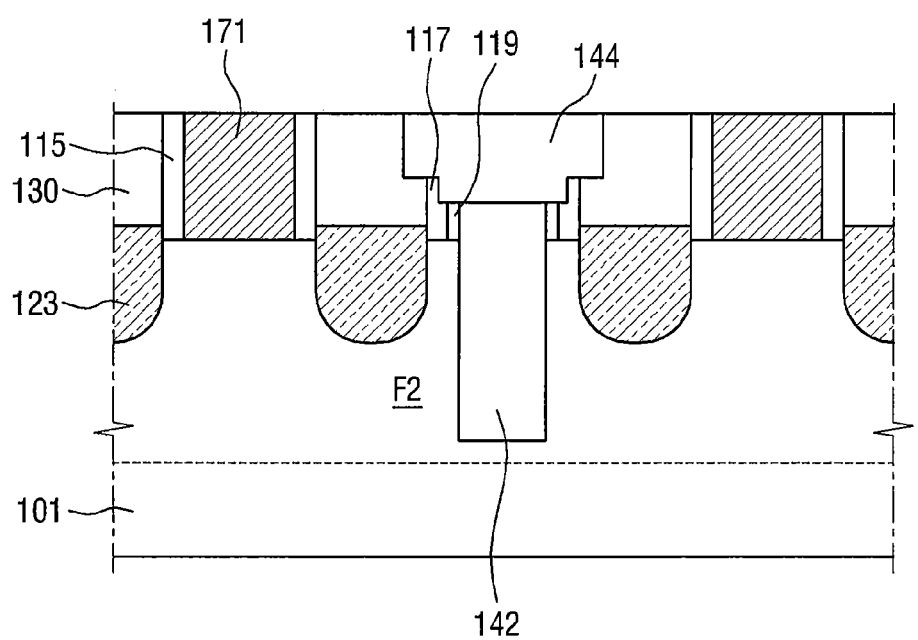

In addition, if the protection layer 148 is completely removed during the process of planarizing the protection layer 148 shown in FIG. 28, a top surface of the second isolation layer 144 may be completely exposed, as shown in FIG. 30, thereby fabricating the semiconductor device 10 shown in FIG. 12C.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
a fin on a substrate and extending in a first direction;
first and second transistors on the fin and spaced apart from each other in the first direction;
a first isolation layer in the fin between the first and second transistors, the first isolation layer extending in a second direction intersecting the first direction and isolating the first and second transistors from each other; and
a second isolation layer on the first isolation layer and extending in the second direction,
wherein the second isolation layer comprises first and second regions comprising different first and second widths, respectively, and
wherein a third width, in the fin, of the first isolation layer is narrower than a fourth width of a protruding portion of the fin.

2. The semiconductor device of claim 1,
wherein the first region of the second isolation layer is on a top portion of the second region of the second isolation layer,
wherein the first width of the first region of the second isolation layer is wider than the second width of the second region of the second isolation layer, and
wherein the third width of the first isolation layer is narrower than the first and second widths of the second isolation layer.

3. The semiconductor device of claim 1, wherein the third width of the first isolation layer is narrower than the first and second widths of the second isolation layer.

4. The semiconductor device of claim 3, further comprising:
first and second inner spacers on first and second side surfaces, respectively, of the first isolation layer; and
first and second dummy spacers on third and fourth side surfaces of the first and second inner spacers, respectively,
wherein the inner spacers and the dummy spacers comprise different materials, respectively.

5. The semiconductor device of claim 4,
wherein each of the dummy spacers comprises a third region and a fourth region,
wherein the third and fourth regions comprise different fifth and sixth widths, respectively,
wherein the third region overlaps a portion of the fourth region, and
wherein the fifth width of the third region is narrower than the sixth width of the fourth region.

6. The semiconductor device of claim 1, wherein the first and second isolation layers comprise a nitride layer and an oxide layer, respectively.

7. The semiconductor device of claim 6,
wherein the oxide layer of the second isolation layer comprises a first oxide layer, and
wherein the first isolation layer comprises a second oxide layer upwardly extending along side surfaces of the nitride layer of the first isolation layer.

8. The semiconductor device of claim 7,
wherein the second isolation layer further comprises a third region comprising a fifth width that is different from the first and second widths of the first and second regions,
wherein the third region underlies the second region, and
wherein the fifth width of the third region is narrower than the second width of the second region.

9. The semiconductor device of claim 6,
wherein the oxide layer of the second isolation layer comprises a first oxide layer,
wherein the first isolation layer comprises a second oxide layer, and
wherein the nitride layer of the first isolation layer upwardly extends along side surfaces of the second oxide layer of the first isolation layer.

10. The semiconductor device of claim 1,
wherein the first isolation layer and the second isolation layer comprise the same material, and
wherein the semiconductor device further comprises a gap within the second isolation layer.

11. The semiconductor device of claim 1, further comprising a protection layer on the second isolation layer and comprising a nitride layer.

12. The semiconductor device of claim 1, wherein the first isolation layer protrudes from within the fin beyond an uppermost surface of the fin.

13. A semiconductor device comprising:
a substrate comprising first and second regions;
a first fin in the first region and extending in a first direction;
first and second transistors on the first fin and spaced apart from each other in the first direction;
a first isolation layer in the first fin between the first and second transistors and extending in a second direction intersecting the first direction, the first isolation layer isolating the first and second transistors from each other;
a second fin in the second region and extending in the first direction;
third and fourth transistors on the second fin and spaced apart from each other in the first direction; and
a second isolation layer in the second fin between the third and fourth transistors and extending in the second direction, the second isolation layer isolating the third and fourth transistors from each other,
wherein the first isolation layer comprises first and second regions thereof comprising different first and second widths, respectively, and
wherein the first isolation layer and the second isolation layer comprise different materials, respectively.

14. The semiconductor device of claim 13,
wherein the first and second regions of the substrate comprise a PMOS region and an NMOS region, respectively, and
wherein the first and second isolation layers comprise a tensile stress material and a compressive stress material, respectively.

15. A semiconductor device comprising:
a fin protruding from a substrate;
first and second gate structures on the fin;
a first source or drain region and a second source or drain region on the fin between the first and second gate structures; and
a non-uniformly-wide isolation region comprising:
a first portion thereof in a recess region of the fin that is between and spaced apart from the first source or drain region and the second source or drain region; and
a second portion thereof that overlaps the first portion of the non-uniformly-wide isolation region and extends laterally to overlap an upper surface of the fin, the second portion of the non-uniformly-wide isolation region comprising a first width that is wider than a second width, in the recess region of the fin, of the first portion of the non-uniformly-wide isolation region,
wherein the second width, in the recess region of the fin, of the first portion of the non-uniformly-wide isolation region is narrower than a third width of a protruding portion of the fin.

16. The semiconductor device of claim 15,
wherein the first and second portions of the non-uniformly-wide isolation region comprise first and second isolation layers, respectively, comprising different respective materials, and
wherein the second isolation layer comprises a non-uniformly-wide isolation layer comprising:
the first width; and
a fourth width that is wider than the second width and unequal to the first width.

17. The semiconductor device of claim 16, further comprising a spacer on the fin, the spacer comprising a first portion thereof that is recessed such that a second portion of the spacer protrudes beyond the first portion of the spacer to extend along a side surface of the non-uniformly-wide isolation layer.

18. The semiconductor device of claim 17,
wherein the spacer comprises a first spacer, and
wherein the semiconductor device further comprises:
a second spacer between the first spacer and the first isolation layer;

a protection layer on the second isolation layer; and a gap within the second isolation layer.

19. The semiconductor device of claim 15, wherein:

the substrate comprises first and second regions;

the fin comprises a first fin on the first region of the substrate;

the non-uniformly-wide isolation region comprises a first non-uniformly-wide isolation region; and the semiconductor device further comprises:

a second fin on the second region of the substrate; and a second non-uniformly-wide isolation region spaced apart from and between third and fourth gate structures that are on the second fin, the first and second non-uniformly-wide isolation regions comprising tensile-stress and compressive-stress materials, respectively.

* * * * *